US012250833B2

(12) United States Patent
Chen et al.

(10) Patent No.: US 12,250,833 B2
(45) Date of Patent: Mar. 11, 2025

(54) METHOD FOR MANUFACTURING SEMICONDUCTOR DEVICE STRUCTURE

(71) Applicant: NANYA TECHNOLOGY CORPORATION, New Taipei (TW)

(72) Inventors: Yu-Ping Chen, New Taipei (TW); Chun-Shun Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 395 days.

(21) Appl. No.: 17/562,210

(22) Filed: Dec. 27, 2021

(65) Prior Publication Data

US 2023/0207637 A1 Jun. 29, 2023

(51) Int. Cl.
*H10D 64/01* (2025.01)
*H01L 21/3115* (2006.01)
*H01L 21/3205* (2006.01)

(52) U.S. Cl.
CPC ....... *H10D 64/01* (2025.01); *H01L 21/31155* (2013.01); *H01L 21/32053* (2013.01); *H10D 64/015* (2025.01); *H10D 64/021* (2025.01)

(58) Field of Classification Search
CPC ......... H01L 21/32053; H01L 21/31155; H01L 21/28518; H01L 29/401; H01L 21/76843; H01L 29/41766
See application file for complete search history.

(56) References Cited

U.S. PATENT DOCUMENTS

| 5,567,652 | A | * | 10/1996 | Nishio | ............ H01L 21/28518 |
| | | | | | 257/E21.199 |
| 5,716,862 | A | | 2/1998 | Ahmad et al. | |
| 9,852,947 | B1 | * | 12/2017 | Ko | ..................... H01L 29/6656 |
| 2002/0168853 | A1 | | 11/2002 | Maa et al. | |
| 2004/0063264 | A1 | | 4/2004 | Zheng et al. | |
| 2004/0169217 | A1 | | 9/2004 | Houston | |
| 2005/0093059 | A1 | | 5/2005 | Belyansky et al. | |
| 2006/0003530 | A1 | * | 1/2006 | Kim | .................. H01L 21/76831 |
| | | | | | 438/258 |

(Continued)

FOREIGN PATENT DOCUMENTS

EP 1315200 A1 5/2003
JP 2017017683 A 1/2017

(Continued)

OTHER PUBLICATIONS

Saranga, A., Nanofabrication, Elsevier Ltd., Section 5.2.2 (Year: 2016).*

(Continued)

*Primary Examiner* — Syed I Gheyas
*Assistant Examiner* — Casey Paul Boatman
(74) *Attorney, Agent, or Firm* — Xuan Zhang

(57) ABSTRACT

A method for manufacturing semiconductor device structure includes providing a substrate having a surface; forming a first gate structure on the surface; forming a second gate structure on the surface; forming a first well region in the substrate and between the first gate structure and the second gate structure; forming a conductive contact within a trench between the first gate structure and the second gate structure; forming a first structure in the first well region, wherein the first structure tapers away from a bottom portion of the conductive contact.

20 Claims, 28 Drawing Sheets

(56) References Cited

U.S. PATENT DOCUMENTS

| | | |
|---|---|---|
| 2006/0281241 A1 | 12/2006 | Mathew |
| 2007/0093047 A1 | 4/2007 | Okuno |
| 2008/0070370 A1* | 3/2008 | Wu .................... H01L 29/665 438/301 |
| 2008/0135894 A1 | 6/2008 | Bohr et al. |
| 2011/0254105 A1* | 10/2011 | Cheng ................ H01L 21/3065 438/300 |
| 2012/0001254 A1 | 1/2012 | Kronholz et al. |
| 2013/0049200 A1* | 2/2013 | Besser .................... H01L 29/00 257/E29.146 |
| 2014/0084340 A1* | 3/2014 | Wang ................ H01L 29/7848 257/190 |
| 2014/0141589 A1 | 5/2014 | Shin et al. |
| 2015/0270222 A1 | 9/2015 | Alptekin et al. |
| 2016/0133721 A1* | 5/2016 | Cai .................. H01L 21/32053 257/506 |
| 2017/0278849 A1 | 9/2017 | Mori |
| 2018/0151425 A1* | 5/2018 | Sun .................. H01L 21/76829 |
| 2018/0197916 A1 | 7/2018 | Yokoyama et al. |
| 2018/0233509 A1 | 8/2018 | Cai et al. |
| 2019/0097012 A1* | 3/2019 | Hung ................. H01L 29/456 |
| 2020/0035915 A1 | 1/2020 | Reznicek et al. |
| 2020/0098646 A1 | 3/2020 | Chen et al. |
| 2020/0135871 A1* | 4/2020 | Tsai .................. H01L 29/41766 |
| 2021/0118994 A1* | 4/2021 | Tsai .................. H01L 27/0924 |
| 2021/0280686 A1* | 9/2021 | Amano ............. H01L 29/66492 |

FOREIGN PATENT DOCUMENTS

| | | |
|---|---|---|
| KR | 1020060001230 A | 1/2006 |
| TW | 200913274 A | 3/2009 |
| TW | 202207295 A | 2/2022 |

OTHER PUBLICATIONS

Notice of Allowance dated Dec. 20, 2022 related to Taiwanese Application No. 111110906.

Summary translation of the Notice of Allowance dated Dec. 20, 2022 related to Taiwanese Application No. 111110906.

Phyllis S. Y. Lim, Dong Zhi Chi, Qian Zhou, and Yee-chia Yeo, "NiSi2 formation through annealing of nickel and dysprosium stack on Si(100) and impact on effective schottky barrier height," Journal of Applied Physics 113, 013712-1, Jan. 7, 2013.

Seokmo Hong, Chang-Seok Lee, Min-Hyun Lee, Yeongdong Lee, Kyung Yeol Ma, Gwangwoo Kim, Seong In Yoon, Kyuwook Ihm, Ki-Jeong Kim, Tae Joo Shin, Sang Won Kim, Eun-chae Jeon, Hansol Jeon, Ju-Young Kim, Hyung-Ik Lee, Zonghoon Lee, Aleandro Antidormi, Stephan Roche, Manish Chhowalla, Hyeon-Jin Shin and Hyeon Suk Shin, "Ultralow-dielectric-constant amorphous boron nitride," Nature vol. 582, Jun. 25, 2020.

Office Action mailed on Sep. 19, 2022 related to U.S. Appl. No. 17/562,362.

\* cited by examiner

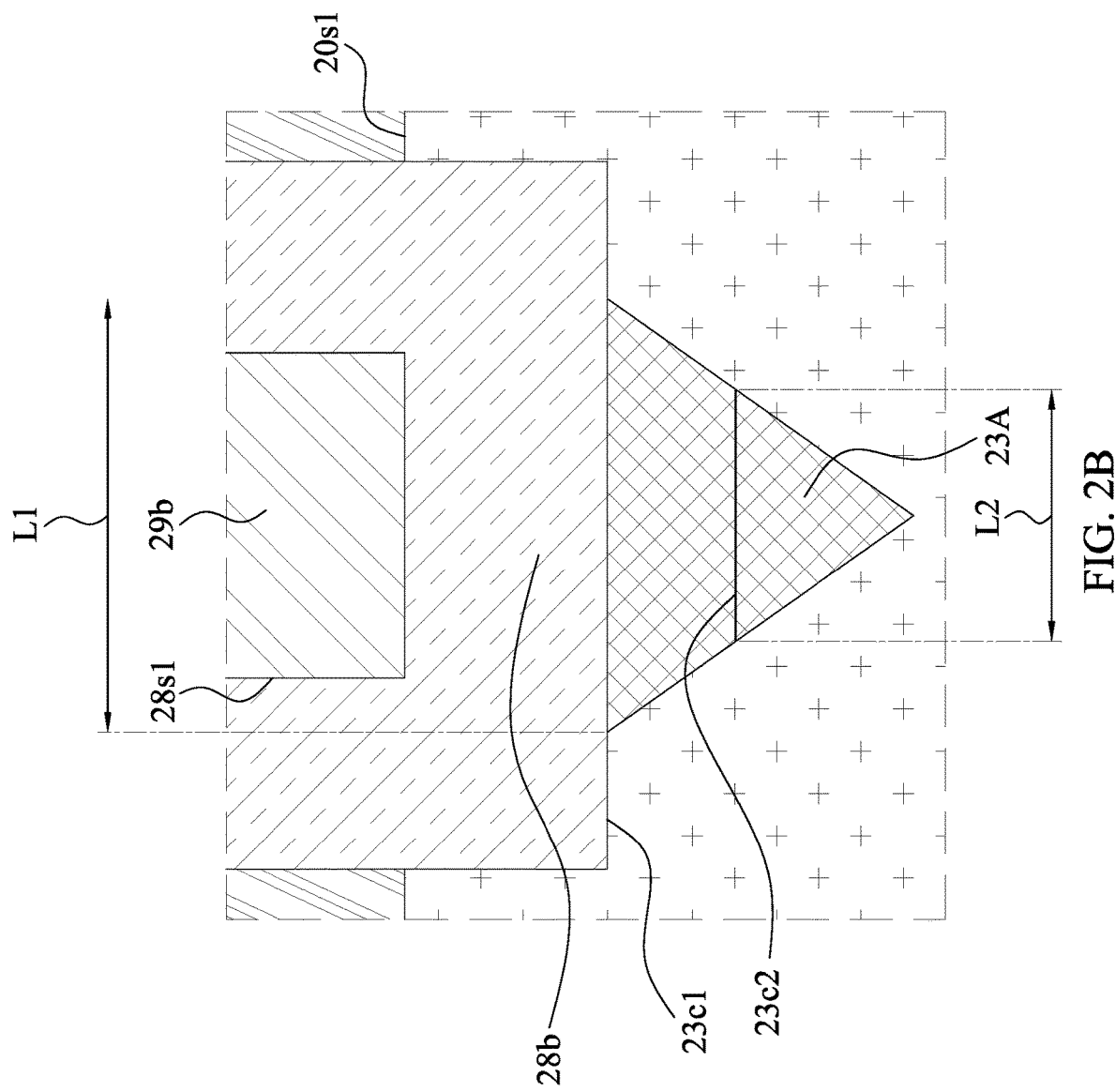

METHOD FOR MANUFACTURING SEMICONDUCTOR DEVICE STRUCTURE

TECHNICAL FIELD

The present disclosure relates to a method for manufacturing a semiconductor device structure, and more particularly, to a method for manufacturing a semiconductor device structure including a cobalt silicide structure having an acute angle.

DISCUSSION OF THE BACKGROUND

As area occupied by integrated circuits is reduced, distance between contacts and gate structure is reduced commensurately, which can cause source/drain leakage. Silicon oxide or silicon nitride may be used to prevent metal silicide from forming on side surfaces of a contact of a semiconductor device. However, this can further increase contact resistance, which may adversely affect performance of the semiconductor device.

The Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes a substrate, a first gate structure, a second gate structure, a first well region, and a first structure. The substrate has a first surface and a second surface opposite to the first surface. The first gate structure is disposed on the first surface. The second gate structure is disposed on the first surface. The first well region is in the substrate and between the first gate structure and the second gate structure. The first structure is disposed in the first well region. A shape of the first structure has an acute angle.

Another aspect of the present disclosure provides a semiconductor device structure. The semiconductor device structure includes a substrate, a first gate structure, a second gate structure, a conductive contact, a first well region, and a first structure. The substrate has a surface. The first gate structure is disposed on the first surface. The second gate structure is disposed on the first surface. The conductive contact is between the first gate structure and the second gate structure. The first well region is in the substrate and between the first gate structure and the second gate structure. The first structure is embedded within the first well region and tapers away from a bottom portion of the conductive contact. The first structure comprises cobalt silicide.

Another aspect of the present disclosure provides a method for manufacturing a semiconductor device structure. The method includes: providing a substrate having a first surface; forming a first gate structure on the surface; forming a second gate structure on the surface; forming a first well region in the substrate and between the first gate structure and the second gate structure; forming a conductive contact within a trench between the first gate structure and the second gate structure; and forming a first structure in the first well region, wherein the first structure tapers away from a bottom portion of the conductive contact.

The embodiments of the present disclosure disclose a semiconductor device structure with a metal silicide in a substrate. The aforesaid metal silicide is absent from sidewalls of a trench between gate structures of the semiconductor device structure. This lowers contact resistance in the semiconductor device structure. Further, the semiconductor device structure includes a titanium nitride layer. The titanium nitride layer is used as a diffusion barrier layer for forming the metal silicide. The thickness of the titanium nitride layer is adjustable to prevent the metal silicide from forming on the sidewalls of the trench between gate structures of the semiconductor device structure, and to prevent the contact resistance from increasing. In a comparative example, silicon oxides/silicon nitrides are formed on the sidewalls of the trench between gate structures of the semiconductor device structure. The silicon oxides/silicon nitrides have larger contact resistances and thus increase the contact resistance between the gate structure and the metal silicide. In comparison with the comparative example, the thickness of the titanium nitride in the embodiments of the present disclosure can be adjusted, so as to prevent the metal silicide from forming on the sidewalls of the trench between gate structures of the semiconductor device structure and to prevent the contact resistance from increasing, and thus the performance of the semiconductor device structure can be improved.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 2B is an enlarged view of the dotted-rectangle A shown in FIG. 2A, in accordance with some embodiments of the present disclosure.

FIG. 3A, FIG. 3B, FIG. 3C, FIG. 3D, FIG. 3E, FIG. 3F, FIG. 3G, FIG. 3H, FIG. 3I, and FIG. 3J illustrate various stages of manufacturing a semiconductor device structure, in accordance with some embodiments of the present disclosure.

FIG. 3A, FIG. 3B, FIG. 3C, FIG. 3D, FIG. 3F, FIG. 3G, FIG. 3K, FIG. 3L, and FIG. 3M illustrate various stages of manufacturing a semiconductor device structure, in accordance with some embodiments of the present disclosure.

FIG. 3A, FIG. 3B, FIG. 3C, FIG. 3D, FIG. 3E, FIG. 3F, FIG. 3G, FIG. 3K, FIG. 3L, and FIG. 3M illustrate various stages of manufacturing a semiconductor device structure, in accordance with some embodiments of the present disclosure.

DETAILED DESCRIPTION

Figure 1A:
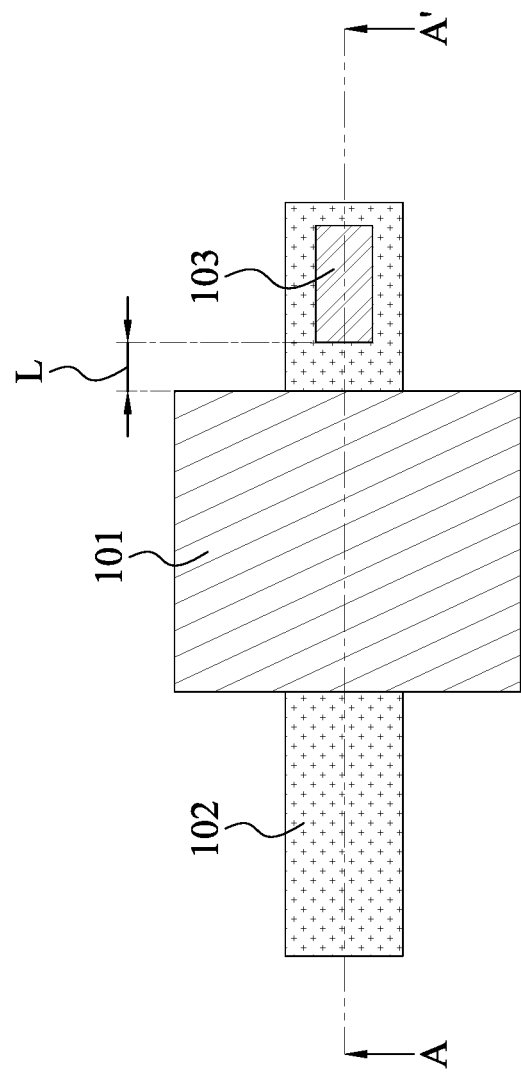
FIG. 1A is a schematic diagram of a top view of a layout of the gate and source/drain regions of a semiconductor device structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
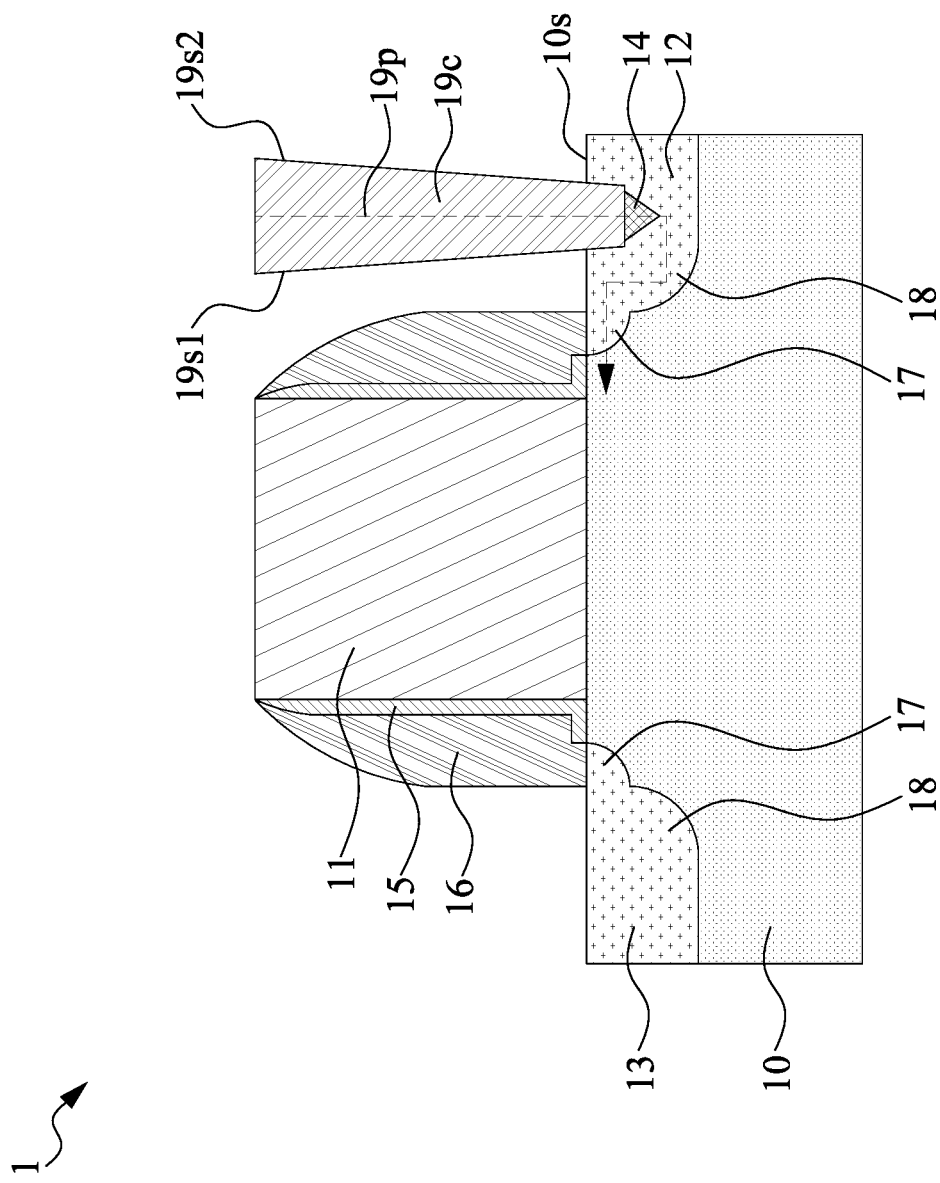
FIG. 1B is a cross-sectional view of a semiconductor device structure, along the dotted line A-A' shown in FIG. 1A, in accordance with some embodiments of the present disclosure.

Referring to FIG. 1A and FIG. 1B. FIG. 1A is a schematic diagram of a top view of a layout of a semiconductor device structure 1. The layout includes gate region 101 and source/drain regions 102. FIG. 1B is a cross-sectional view of the semiconductor device structure 1, along the dotted line A-A' shown in FIG. 1A.

Referring to FIG. 1A, a contact region 103 is spaced apart from the gate region 101 by a distance L. When the size of the semiconductor device structure 1 is reduced, the distance L needs to be reduced accordingly, since, when the gate length of the semiconductor device structure 1 is reduced, the threshold voltage of the semiconductor device structure 1 becomes difficult to control, which may cause unexpected current leakage. In conventional processes, cobalt silicide is formed on the sidewalls of the contact. The cobalt silicide can be elliptical. The cobalt silicide formed on the sidewalls of the contact may cause current leakage. To prevent the cobalt silicide from forming on the sidewalls of the contact, a layer of silicon nitride is formed on the sidewall of the contact. Although the layer of silicon nitride can prevent the cobalt silicide from forming on the sidewalls of the contact, it will increase contact resistance. The method disclosed herein eliminates the layer of silicon nitride. The cobalt silicide is pyramidal. The cobalt silicide allows the length L to be reduced without causing current leakage, and also reduces contact resistance.

Referring to FIG. 1B, the semiconductor device structure 1 can include a substrate 10, a gate structure 11, a drain region 12, a source region 13, a silicide structure 14, spacers 15 and 16, lightly doped drain (LDD) regions 17, halo regions 18, and a conductive contact 19c. Some elements of the semiconductor device structure 1 are omitted from FIG. 1B for brevity.

The substrate 10 may have a surface 10s. The gate structure 11 is formed on the surface 10s. The drain region 12 is formed below the surface 10s. The source region 13 is formed below the surface 10s. The silicide structure 14 is formed below the surface 10s. The silicide structure 14 may be pyramidal. The silicide structure 14 may be conical. In some embodiments, the silicide structure 14 may be triangular in cross-section. The conductive contact 19c includes sidewalls 19s1 and 19s2. The sidewalls 19s1 and 19s2 of the conductive contact 19c are devoid of the silicide structure 14. The silicide structure 14 is spaced apart from the sidewalls 19s1 and 19s2 of the conductive contact 19c.

A current path 19p through the conductive contact 19c and directed from the drain region 12 to the source region 13 is shown by a dotted line. Using the silicide structure 14, the resistance of the conductive contact 19c can be reduced.

As the semiconductor device structure 1 is reduced, the distance between the drain region 12 and the source region 13 is reduced correspondingly, which causes the carriers at junctions of two ends of the gate structure 11 to speed up by a large electrical field. In some embodiments, a LDD region 17 is formed near the junction between the drain region 12 and one end of the gate structure 11. In some embodiments, another LDD region 17 is formed near the junction between the source region 13 and another end of the gate structure 11. The LDD regions 17 can reduce the amount of the carrier at the junctions, thereby reducing the hot carrier effect for the semiconductor device structure 1. In some embodiments, the LDD regions 17 are formed adjacent to the gate structure 11 using a different dopant material of the same conductivity type as that of the drain region 12 and the source region 13.

In some embodiments, the halo regions 18 are doped regions formed next to the drain region 12 and the source region 13. In some embodiments, the halo regions 18 are formed deeper in the substrate 10 than the LDD regions 17. The halo regions 18 are formed to increase the threshold voltage of the semiconductor device structure 1. The halo regions 18 can reduce the short channel effect of the semiconductor device structure 1. In some embodiments, the halo regions 18 are formed using a dopant material of the same conductivity type as that of the substrate 10.

Figure 2A:
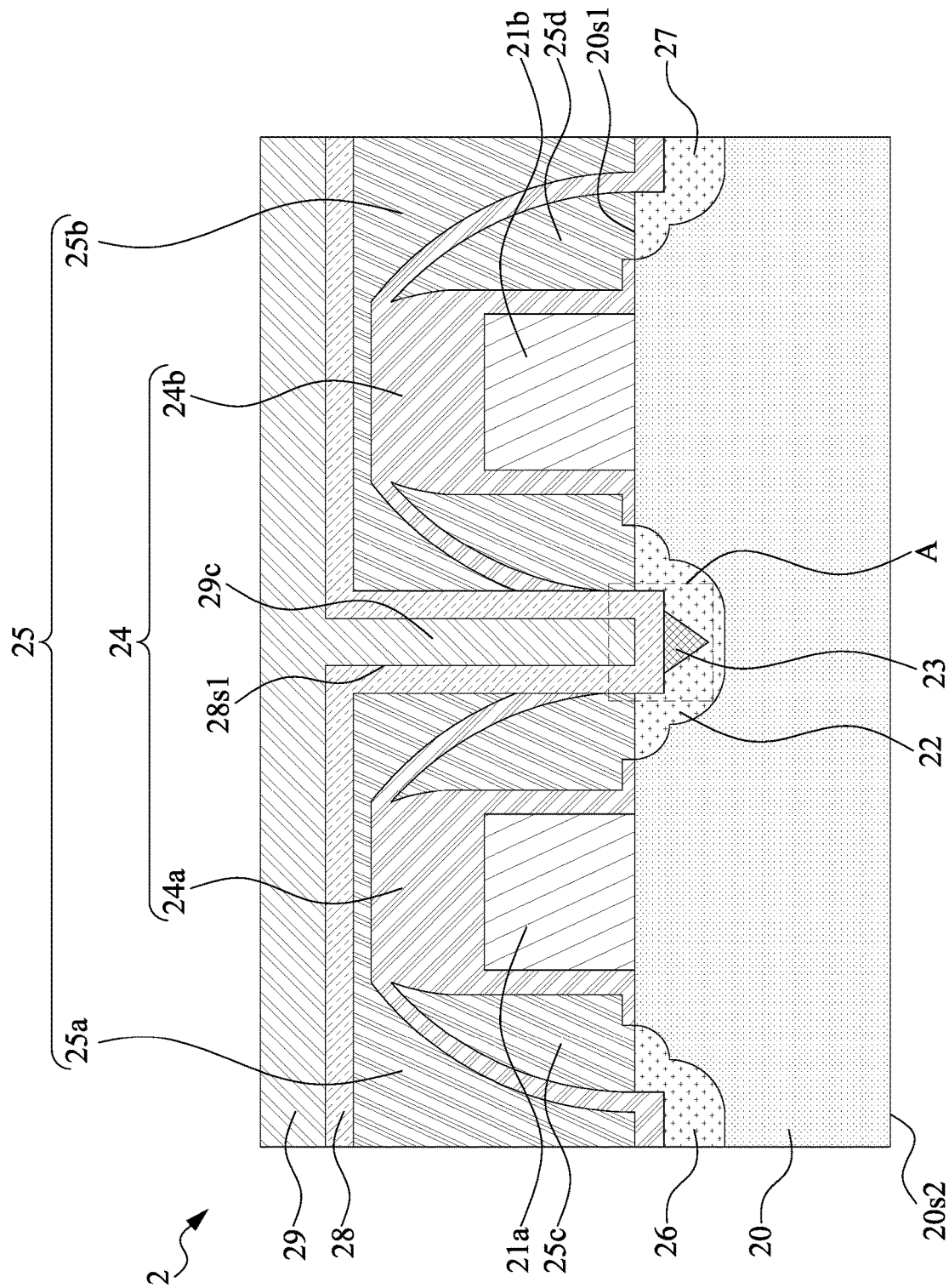
FIG. 2A is a cross-sectional view of a semiconductor device structure, in accordance with some embodiments of the present disclosure.

FIG. 2A is a cross-sectional view of a semiconductor device structure, in accordance with some embodiments of the present disclosure. Referring to FIG. 2A, a semiconductor device structure 2 can include a substrate 20, gate structures 21a and 21b, a structure 23, spacers 24 and 25, and layers 28 and 29. The substrate 20 may have a surface 20s1 (or an upper surface) and a surface 20s2 (or a lower surface). The surface 20s1 is opposite to the surface 20s2. In this disclosure, the surface 20s1 can also be referred to as an active surface. In this disclosure, the surface 20s2 can also be referred to as a rear side surface.

The substrate 20 may be a semiconductor substrate, such as a bulk semiconductor, a semiconductor-on-insulator (SOI) substrate, or the like. In some embodiments, the substrate 20 includes a first conductive type. In some embodiments, the first conductive type is a p-type. In some embodiments, p-type dopants include boron (B), other group III elements, or any combination thereof. In some embodiments, the first conductive type is an n-type. In some embodiments, n-type dopants include arsenic (As), phosphorus (P), other group V elements, or any combination thereof.

The gate structures 21a and 21b are formed on the surface 20s1. A spacer 24 can include two portions 24a and 24b. In some embodiments, the portion 24a of the spacer 24 is formed on the gate structure 21a. In some embodiments, the portion 24b of the spacer 24 is formed on the gate structure 21b. The semiconductor device structure 2 includes a spacer 25. The spacer 25 includes portions 25a and 25b formed on the portions 24a and 24b of the spacer 24. The spacer 25 includes portions 25c and 25d between the substrate 20 and the spacer 24. In some embodiments, the portion 25a of the spacer 25 is formed on the portion 24a of the spacer 24. In some embodiments, the portion 25b of the spacer 25 is formed on the portion 24b of the spacer 24.

A well region 22 is formed in the substrate 20. The well region 22 is formed below the surface 20s1. The well region 22 is formed between the gate structures 21a and 21b. In some embodiments, the well region 22 includes a second conductive type different from the first conductive type of the substrate 20. A structure 23 is formed in the substrate 20. In some embodiments, a structure 23 is formed in the well region 22. In some embodiments, the structure 23 is embedded within the well region 22.

In some embodiments, the portion 24a of the spacer 24 extends continuously from the gate structure 21a to the well region 22. In some embodiments, the portion 24b of the spacer 24 extends continuously from the gate structure 21b to the well region 22. In some embodiments, the portions 25c and 25d of the spacer 25 are encapsulated by the substrate 20 and the spacer 24.

A well region 26 is formed in the substrate 20. In some embodiments, the well region 26 is formed below the surface 20s1. In some embodiments, the well region 26 is embedded within the substrate 20. In some embodiments, the well region 26 includes a second conductivity type different from the first conductive type of the substrate 20. In some embodiments, the portion 24a of the spacer 24 is in contact with the well region 26. In some embodiments, the portion 24a of the spacer 24 extends continuously from the gate structure 21a to the well region 26 in the substrate 20. In some embodiments, the well region 26 is spaced apart from the well region 22.

A well region 27 is formed in the substrate 20. In some embodiments, the well region 27 is formed below the surface 20s1. In some embodiments, the well region 27 is embedded within the substrate 20. In some embodiments, the well region 27 includes the second conductivity type different from the first conductive type of the substrate 20. In some embodiments, the portion 24b of the spacer 24 is in contact with the well region 27. In some embodiments, the portion 24b of the spacer 24 extends continuously from the gate structure 21b to the well region 27 in the substrate 20. In some embodiments, the well region 27 is spaced apart from the well region 22.

A layer 28 is formed on the spacer 25. In some embodiments, the structure 23 is in contact with the layer 28. In some embodiments, a vertical surface 28s1 of the layer 28 is devoid of the structure 23. In some embodiments, the structure 23 is spaced apart from the vertical surface 28s1 of the layer 28. In some embodiments, the layer 28 comprises metal oxides. In some embodiments, the layer 28 comprises metal nitrides. In some embodiments, the layer 28 comprises metal silicides. In some embodiments, the layer 28 comprises titanium nitride. In some embodiments, a thickness of the layer 28 can be adjusted based on demand.

A layer 29 is formed on the layer 28. In some embodiments, the layer 28 is used as a barrier layer to isolate the layer 29 and the substrate 20 and the spacer 25. The layer 29 comprises a conductive contact 29c disposed between the gate structure 21a and the gate structure 21b. The conductive contact 29c can be disposed within a trench between the gate structure 21a and the gate structure 21b. The structure 23 is disposed under the conductive contact 29c. In some embodiments, the layer 28 covers three sidewalls of the conductive contact 29c. The layer 28 is formed on sidewalls of the conductive contact 29c. In some embodiments, the layer 29 comprises metal materials. In some embodiments, the layer 29 comprises tungsten.

FIG. 2B is an enlarged view of the dotted rectangle A shown in FIG. 2A. In some embodiments, the structure 23 has an acute angle 23A in cross-section. In some embodiments, the structure 23 may be pyramidal. In some embodiments, the structure 23 tapers towards the surface 20s2 of the substrate 20. In some embodiments, a vertical surface 28s1 of the layer 28 is devoid of the structure 23. In some embodiments, the structure 23 is spaced apart from the vertical surface 28s1 of the layer 28.

In some embodiments, the structure 23 comprises metal silicides. In some embodiments, the structure 23 comprises cobalt silicide. In some embodiments, a cross section 23C1 of the structure 23 is closer to the surface 20s1 than the cross section 23C2 of the structure 23. The cross section 23C1 of the structure 23 has a length L1. The cross section 23C2 of the structure 23 has a length L2. In some embodiments, the length L2 is different from the length L1. In some embodiments, the length L1 is greater than the length L2.

In some embodiments, the layer 28 comprises a bottom portion 28b embedded within the substrate 20. In some embodiments, the structure 23 is in contact with the bottom portion 28b of the layer 28. In some embodiments, a bottom portion 29b of the layer 29 is in contact with the bottom portion 28b of the layer 28. The structure 23 tapers away from the bottom portion 28b of the layer 28. The structure 23 tapers away from the bottom portion 29b of the conductive contact 29c.

FIG. 3A, FIG. 3B, FIG. 3C, FIG. 3D, FIG. 3F, FIG. 3G, FIG. 3H, FIG. 3I, and FIG. 3J illustrate various stages of manufacturing a semiconductor device structure, in accordance with some embodiments of the present disclosure.

Figure 3A:
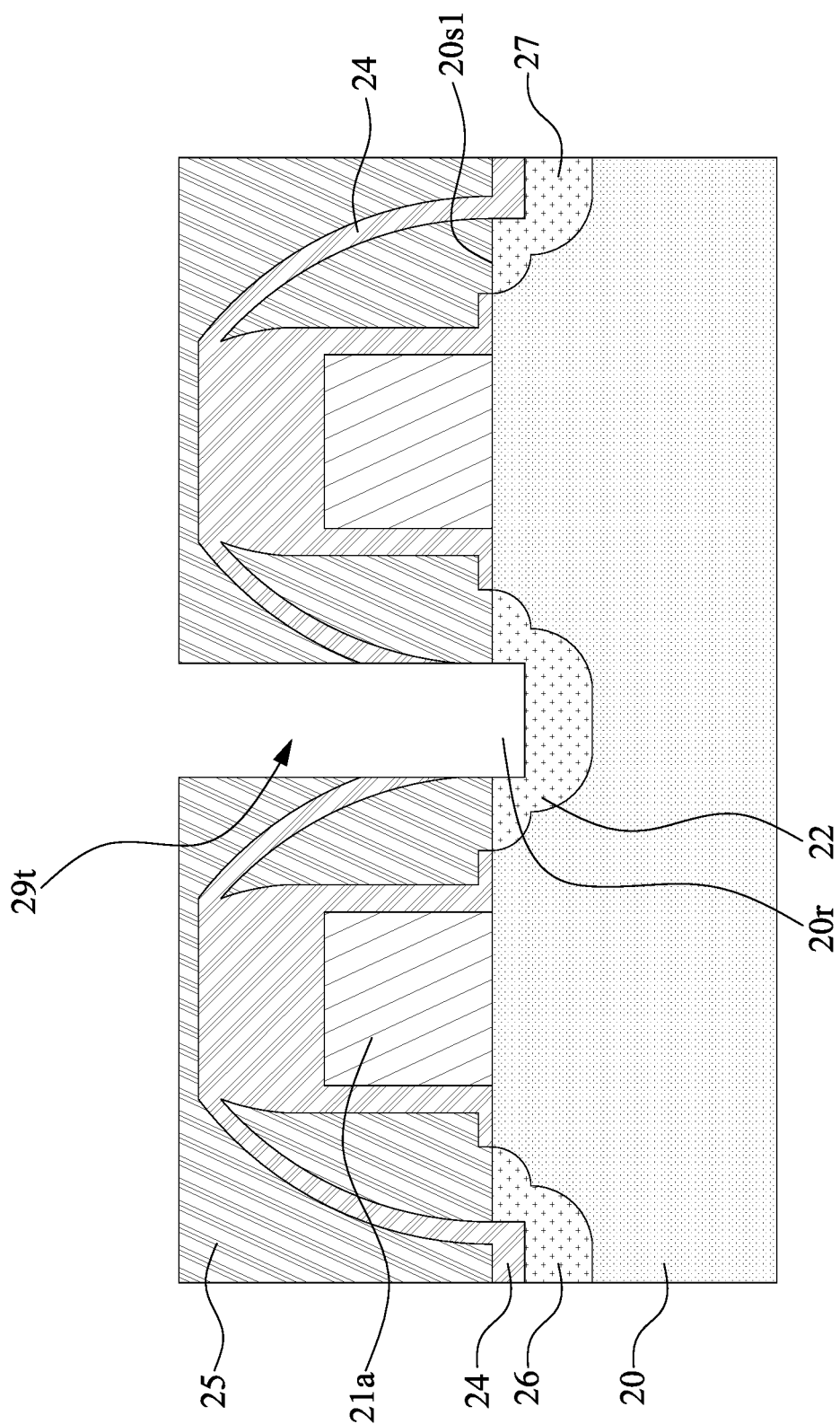
FIG. 3A, FIG. 3B, FIG. 3C, FIG. 3D, FIG. 3F, FIG. 3G, FIG. 3H, FIG. 3I, and FIG. 3J illustrate various stages of manufacturing a semiconductor device structure, in accordance with some embodiments of the present disclosure.

Referring to FIG. 3A, a substrate 20 can be provided. A gate structure 21a can be formed on a surface 20s1 of the substrate 20. A gate structure 21b can be formed on the surface 20s1 of the substrate 20. A well region 22 can be formed in the substrate 20. In some embodiments, the well region 22 can be formed between the gate structures 21a and 21b. A spacer 24 can be formed on the gate structures 21a and 21b. A spacer 25 can be formed on the spacer 24. A well region 26 can be formed in the substrate 20. In some embodiments, the well region 26 can be formed below the surface 20s1 of the substrate 20.

In some embodiments, a portion of the spacer 24 is in contact with the well region 26. In some embodiments, a portion of the spacer 24 is embedded in the well region 26. A well region 27 can be formed in the substrate 20. The well region 27 can be formed below the surface 20s1 of the substrate 20. In some embodiments, a portion of the spacer 24 is in contact with the well region 27. In some embodiments, a portion of the spacer 24 is embedded in the well region 27. In some embodiments, the substrate 20 has a recessed portion 20r. The recessed portion 20r is recessed below the surface 20s1. In some embodiments, a trench 29t is formed between the gate structures 21a and 21b, defined by the spacer 25 and the recessed portion 20r of the substrate 20.

Figure 3B:
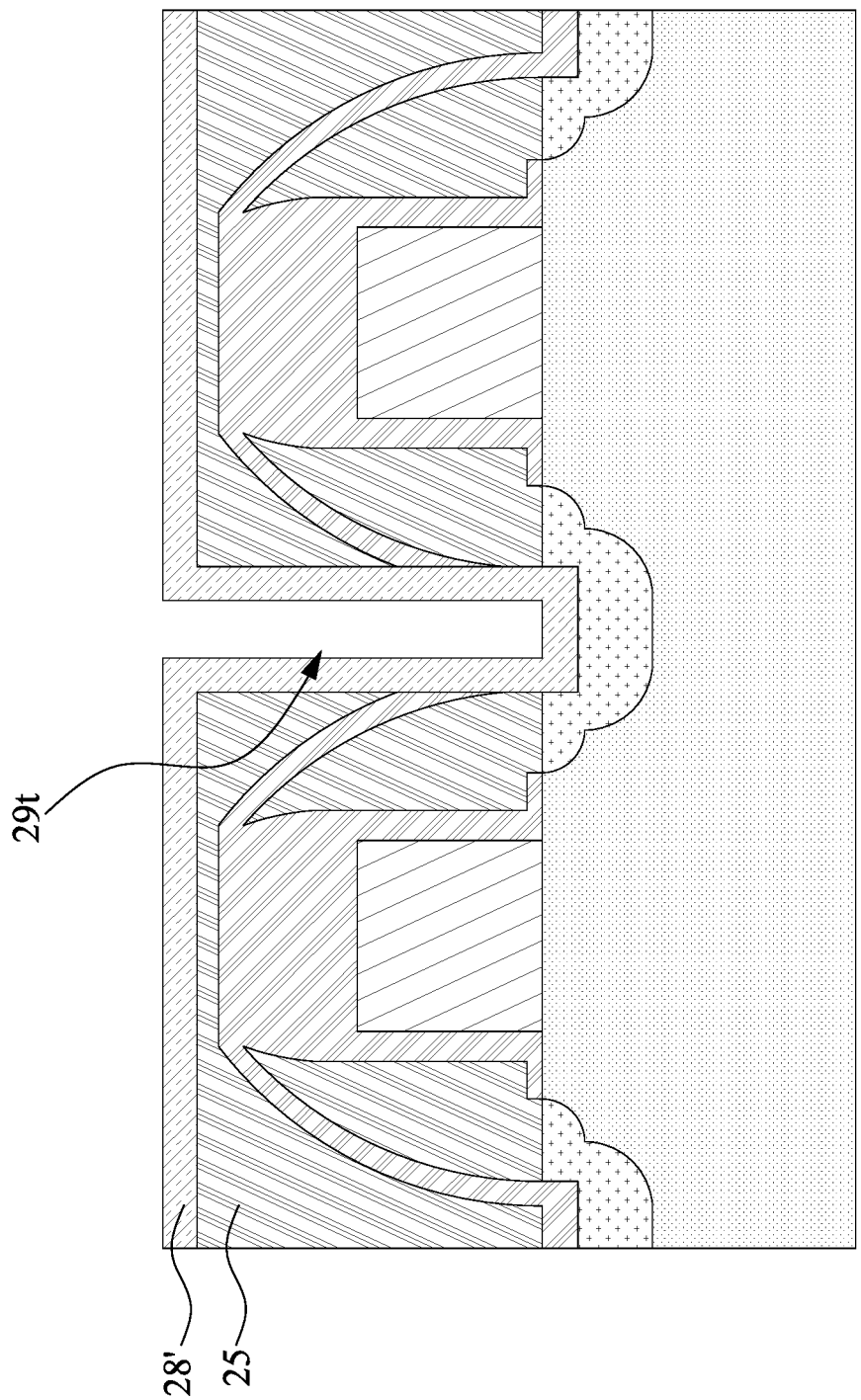

Referring to FIG. 3B, a layer 28' can be formed on the spacer 25. The layer 28' can be formed by chemical vapor deposition (CVD), plasma enhanced CVD (PECVD), flowable CVD (FCVD), spin coating, sputtering or the like. The layer 28' is also formed on the recessed portion 20r of the substrate 20 and the sidewalls of the trench 29t. In some embodiments, the layer 28' comprises one of titanium, titanium nitride, tantalum, tantalum nitride, silicon oxide, silicon nitride, or the like. In some embodiments, the layer 28' comprises titanium nitride.

Figure 3C:
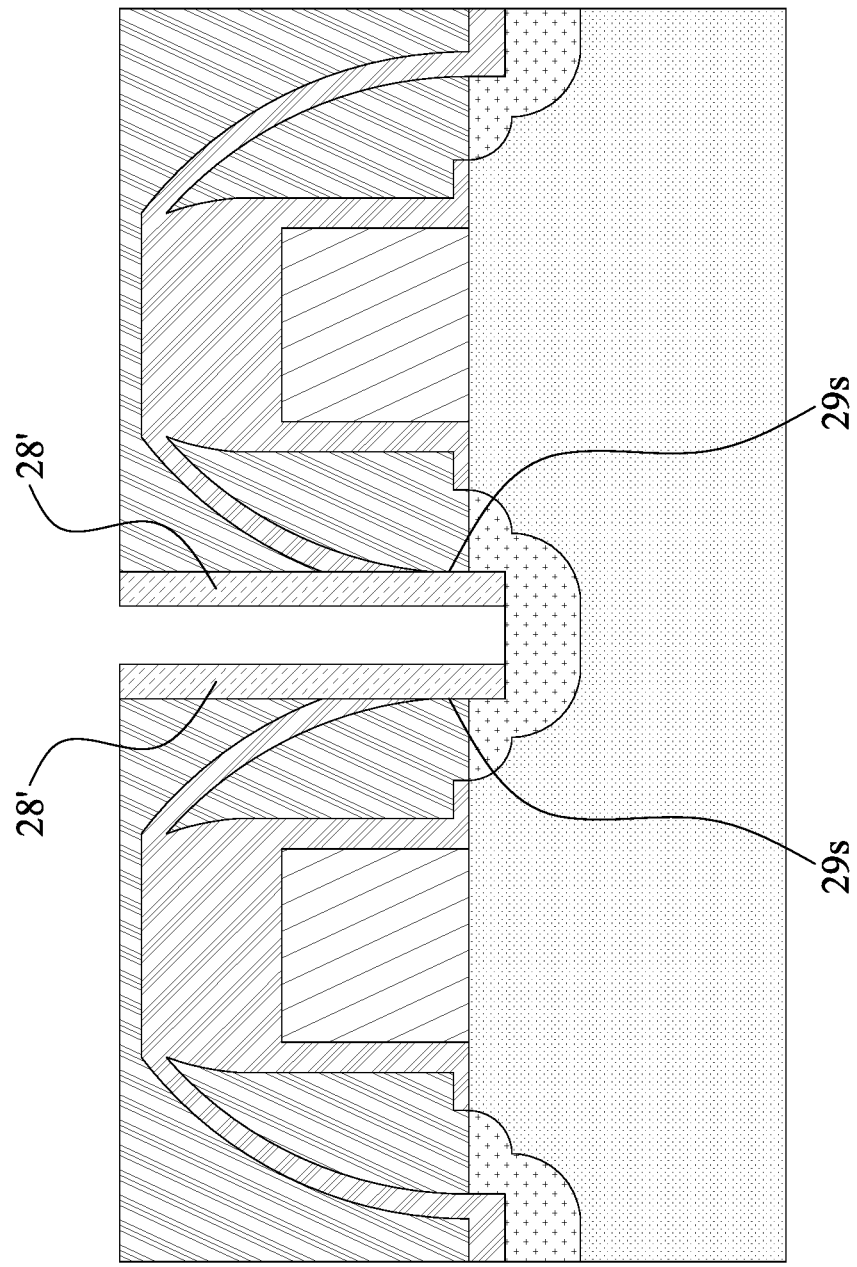

Referring to FIG. 3C, portions of the layer 28' are removed, and portions of the layer 28' formed on the sidewalls 29s of the trench 29t are retained. In some embodiments, the layer 28' formed on the spacer 25 is removed. In some embodiments, a portion of the layer 28' formed on the recessed portion 20r of the substrate 20 is removed. The portions of layer 28' can be removed by, for example, etching techniques. In some embodiments, the etching techniques comprise dry etching, wet etching, or the like. In some embodiments, the layer 28' is used to prevent the structure 23 shown in FIG. 2A from being formed on the sidewalls 29s of the trench 29t.

Figure 3D:
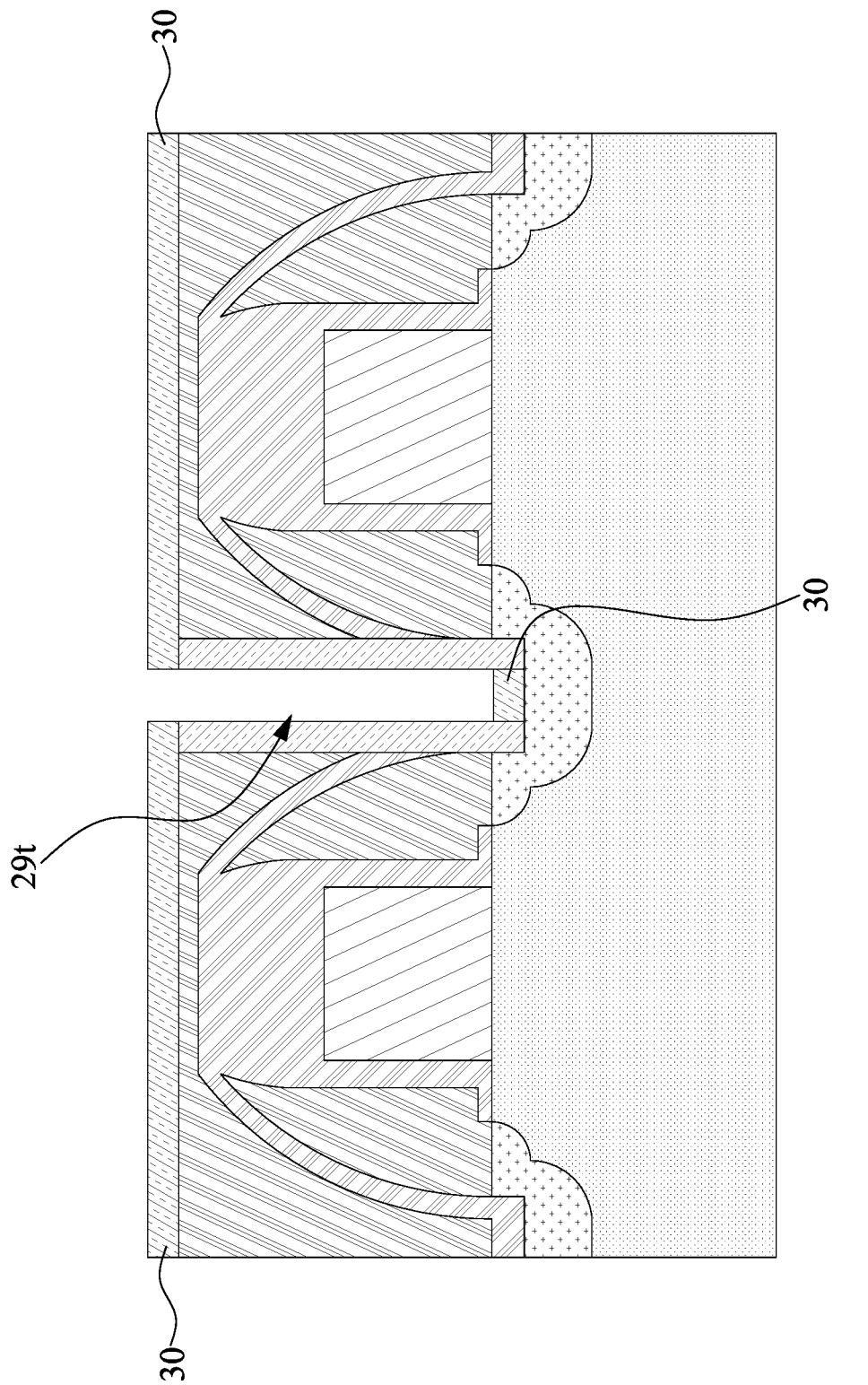

Referring to FIG. 3D, a layer 30 is formed on the spacer 25 and the recessed portion 20r of the substrate 20. In some embodiments, the layer 30 is formed on a bottom portion of the trench 29t. In some embodiments, the layer 30 can be formed by, for example, physical vapor deposition (PVD). The deposition consistency of the layer 28' formed by CVD is different from that of the layer 30 formed by PVD. The crystal density of the layer 28' formed by CVD is different from that of the layer 30 formed by PVD. In some embodiments, the layer 30 comprises one of titanium, titanium nitride, tantalum, tantalum nitride, silicon oxide, silicon nitride, or the like. In some embodiments, the layer 30 comprises titanium nitride.

Figure 3E:
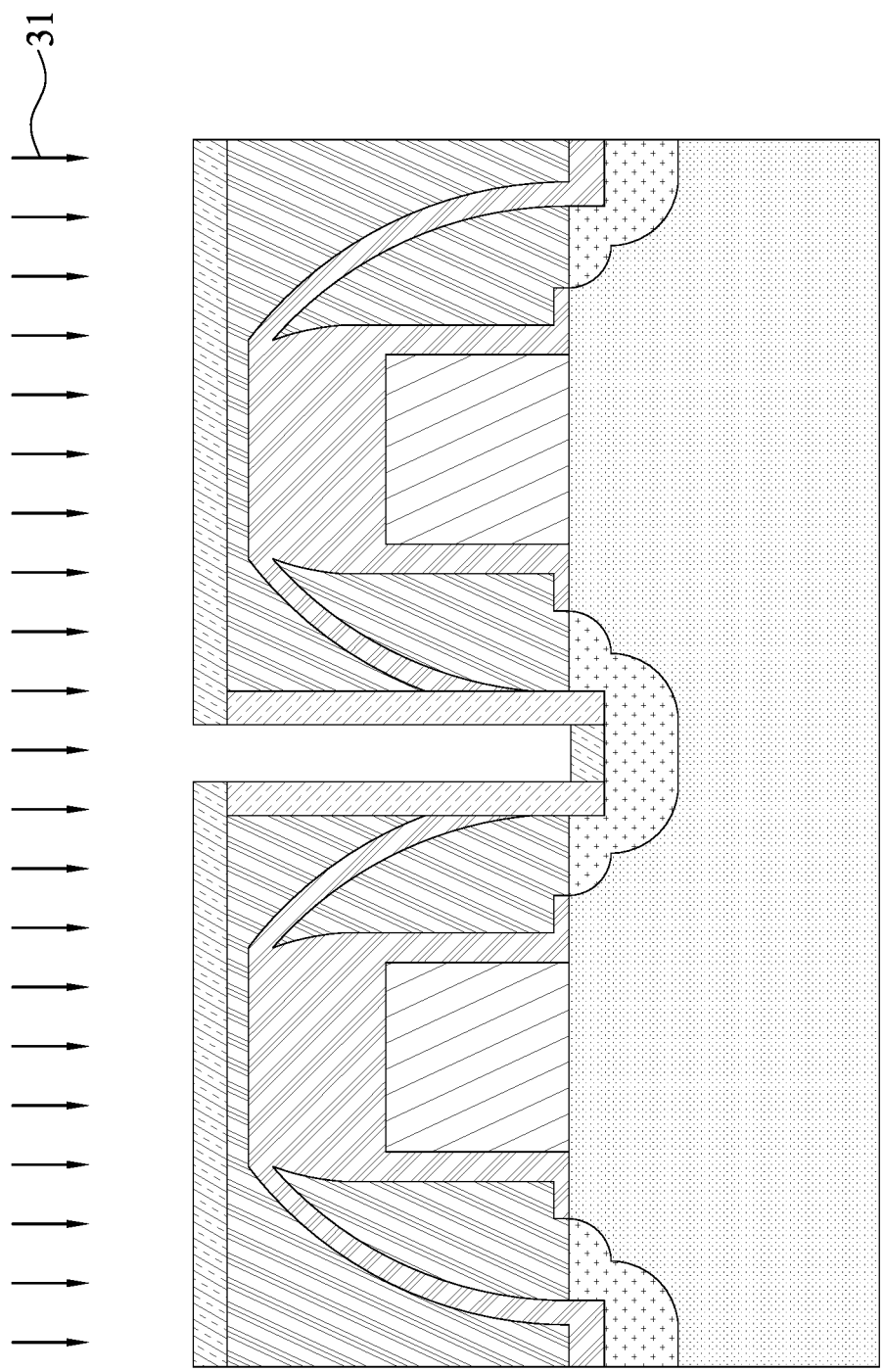
Figure 3F:
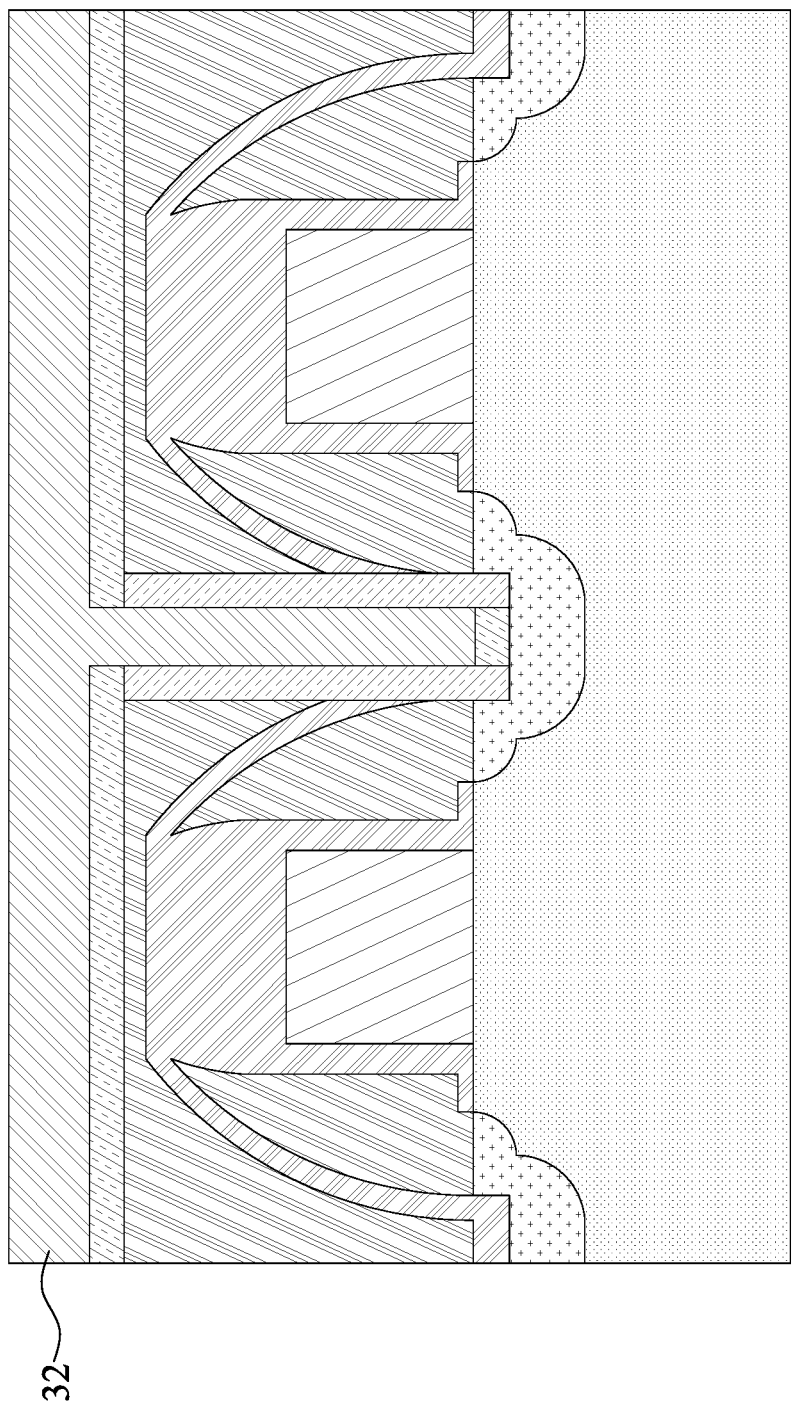

Referring to FIG. 3F, a layer 32 is formed on the layer 30. The layer 32 is in contact with the layer 30. A portion of the layer 32 is formed within the trench 29t. A portion of the layer 32 fills up the trench 29t. In some embodiments, the layer 32 comprises metal materials. In some embodiments, the layer 32 comprises cobalt. In some embodiments, the layer 32 is formed by plasma-enhanced Atomic Layer Deposition (ALD).

Figure 3G:
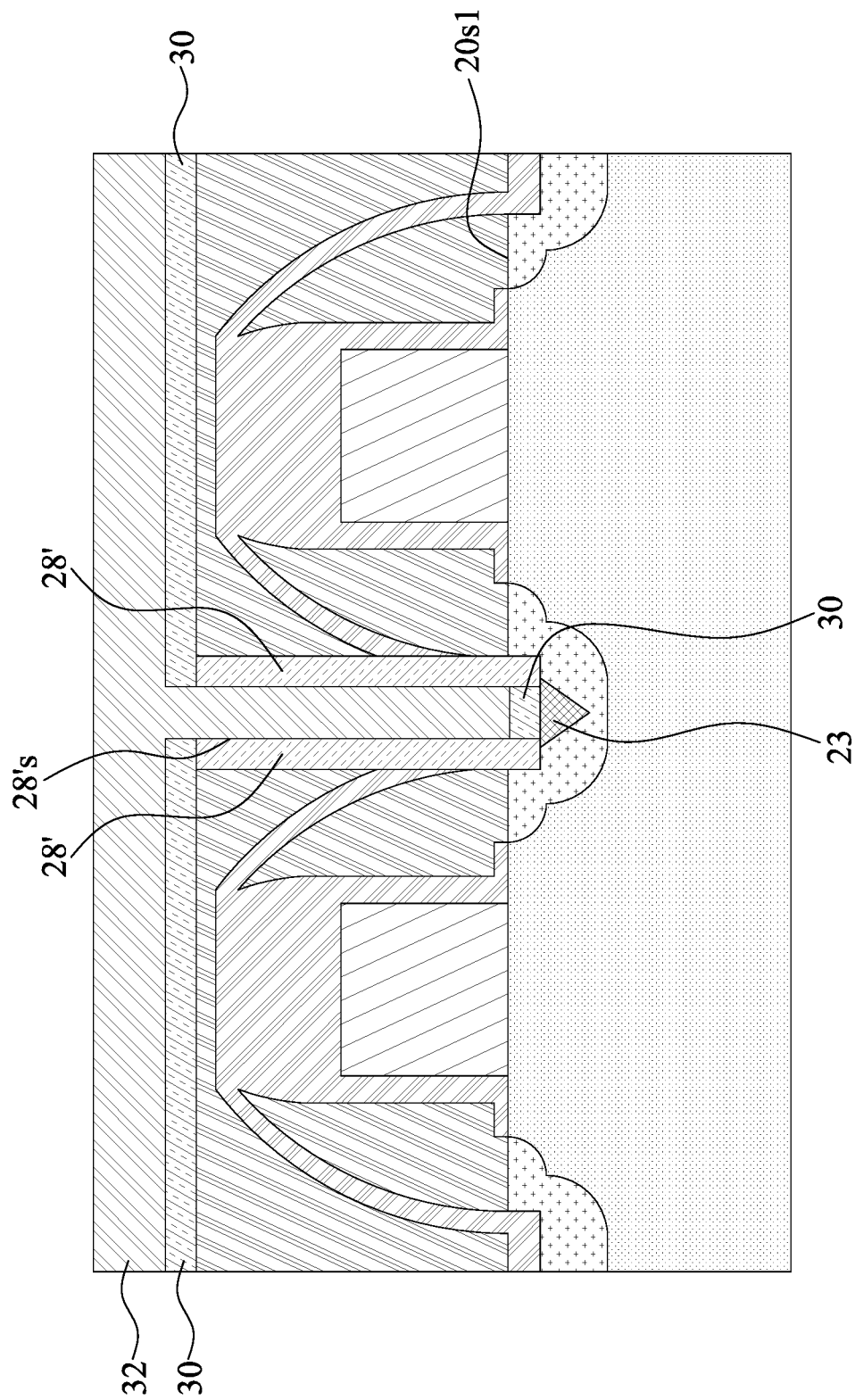

Referring to FIG. 3G, a thermal process is performed on the structure shown in FIG. 3F. In some embodiments, the layer 30 acts as a diffusion barrier layer for forming the structure 23 in the substrate 20. In some embodiments, the layer 30 is used as a silicide phase change layer. During the thermal process, materials of the layer 32 interact with materials of the substrate 20, and the structure 23 gradually forms from the layer 30 toward the well region 22.

The structure 23 is in contact with the layer 30. In some embodiments, the structure 23 is absent from a vertical surface 28's of the layer 28'. In some embodiments, the structure 23 is not in contact with the layer 28'. In some embodiments, the structure 23 is not in contact with the layer 32. The structure 23 is formed in the well region 22. In some embodiments, the structure 23 tapers away from the surface 20s1.

Figure 3H:
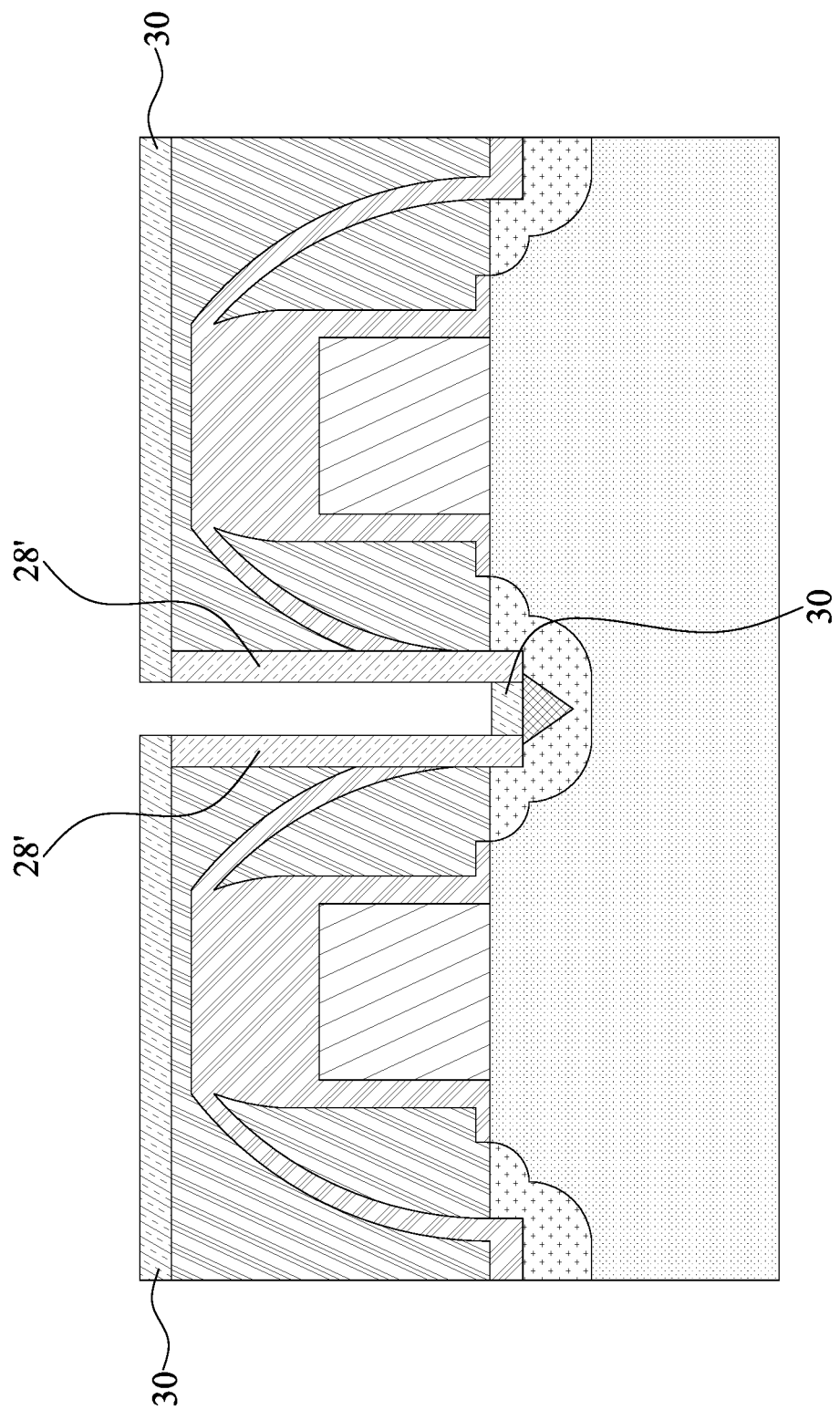

Referring to FIG. 3H, the layer 32 is removed. The layer 32 is removed by, for example, etching techniques. In some embodiments, the etching techniques comprise dry etching, wet etching, or the like. In some embodiments, portions of the layer 30 are retained on the spacer 25 and the recessed portion 20r of the substrate 20. In some embodiments, portions of the layer 28' are retained on the sidewall 29s of the trench 29t.

Figure 3I:
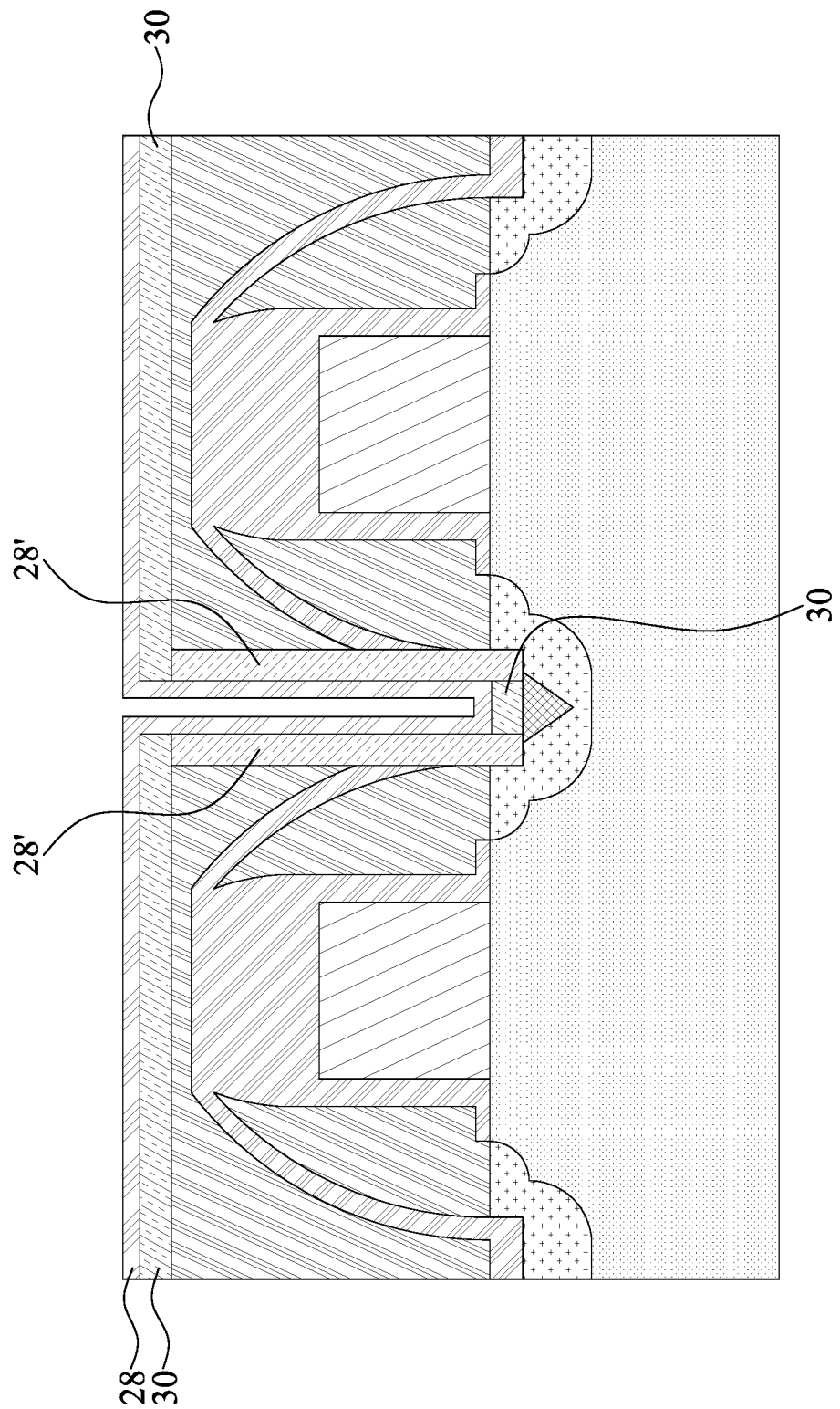

Referring to FIG. 3I, a layer 28 can be formed on the structure shown in FIG. 3H. In some embodiments, the layer 28 is formed on the remaining portions of the layer 30 and the remaining portions of the layer 28'. In some embodiments, the layer 28 can be formed by chemical vapor deposition (CVD). In some embodiments, the layer 28 comprises one of titanium, titanium nitride, tantalum, tantalum nitride, silicon oxide, silicon nitride, or the like. In some embodiments, the layer 28 comprises titanium nitride. A thickness of the layer 28 is adjustable based on demands. In some embodiments, the total thickness of the layers 28 and 28' may be in a range of about 1 to 5 nm. In some embodiments, the total thickness of the layers 28 and 30 may be in a range of about 1 to 5 nm. In some embodiments, the total thickness of the layers 28 and 28' may be about 3 nm. In some embodiments, the total thickness of the layers 28 and 30 may be about 3 nm.

Figure 3J:
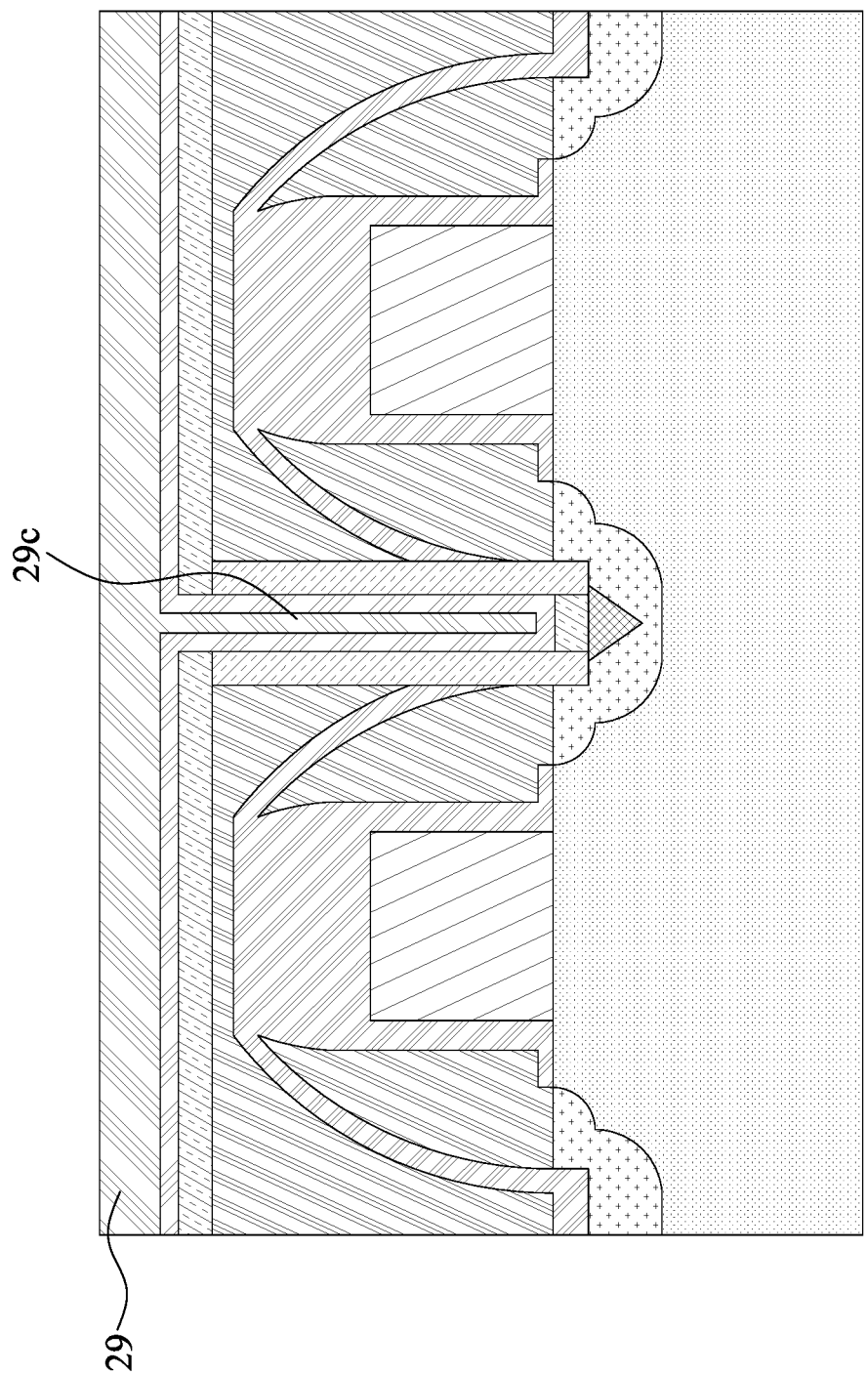

Referring to FIG. 3J, a layer 29 can be formed on the layer 28. In some embodiments, the layer 28 is used as a barrier layer to prevent the layer 29 from penetrating into the substrate 20. In some embodiments, the layer 29 can be formed by chemical vapor deposition (CVD). The layer 29 is also formed within the trench 29t. In some embodiments, the layer 29 formed within the trench 29t is a conductive contact 29c. The conductive contact 29c is formed between the gate structures 21a and 21b. In some embodiments, the layer 29 comprises metal materials. In some embodiments, the layer 29 comprises tungsten.

FIG. 3A, FIG. 3B, FIG. 3C, FIG. 3D, FIG. 3E, FIG. 3F, FIG. 3G, FIG. 3H, FIG. 3I, and FIG. 3J illustrate various stages of manufacturing a semiconductor device structure, in accordance with some embodiments of the present disclosure.

The stages of FIG. 3A, FIG. 3B, FIG. 3C, FIG. 3D, FIG. 3F, FIG. 3G, FIG. 3H, FIG. 3I, and FIG. 3J are the same as stated previously. FIG. 3E follows the stage of FIG. 3D. Referring to FIG. 3E, a preamorphous implant (PAI) 31 is performed on the layer 30. After the PAI, the structure of the layer 30 is degraded. In some embodiments, the layer 30 becomes amorphous. Afterwards, the stages of FIG. 3F, FIG. 3G, FIG. 3H, FIG. 3I and FIG. 3J follows the stage of FIG. 3E. In some embodiments, the stage of FIG. 3E may be optional. By implementing the stage of FIG. 3E, the amorphous atoms of the layer 32 may be easier to migrate into the substrate 20 to form the structure 23.

FIG. 3A, FIG. 3B, FIG. 3C, FIG. 3D, FIG. 3F, FIG. 3G, FIG. 3K, FIG. 3L, and FIG. 3M illustrate various stages of manufacturing a semiconductor device structure, in accordance with some embodiments of the present disclosure.

Figure 3K:
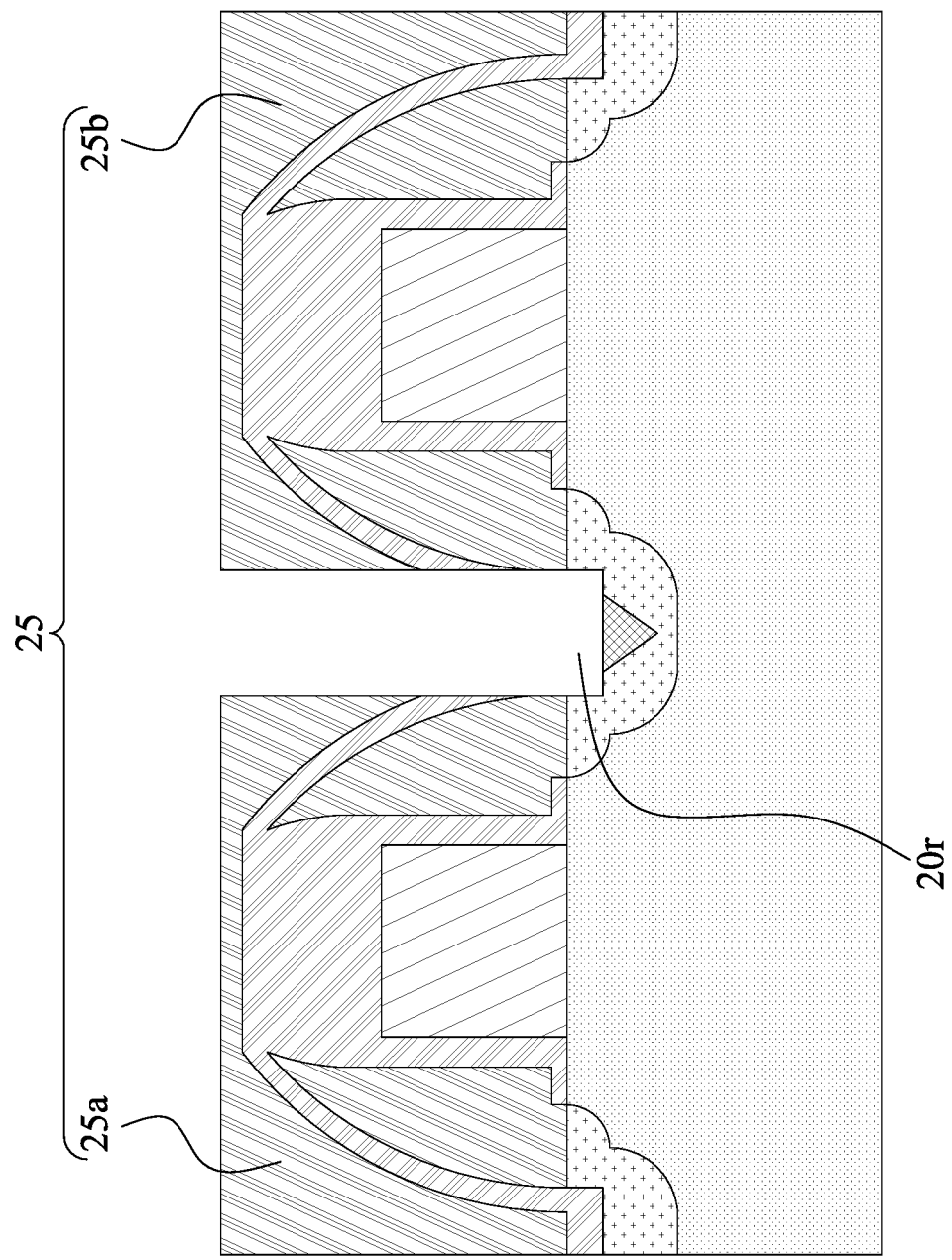
Figure 3L:
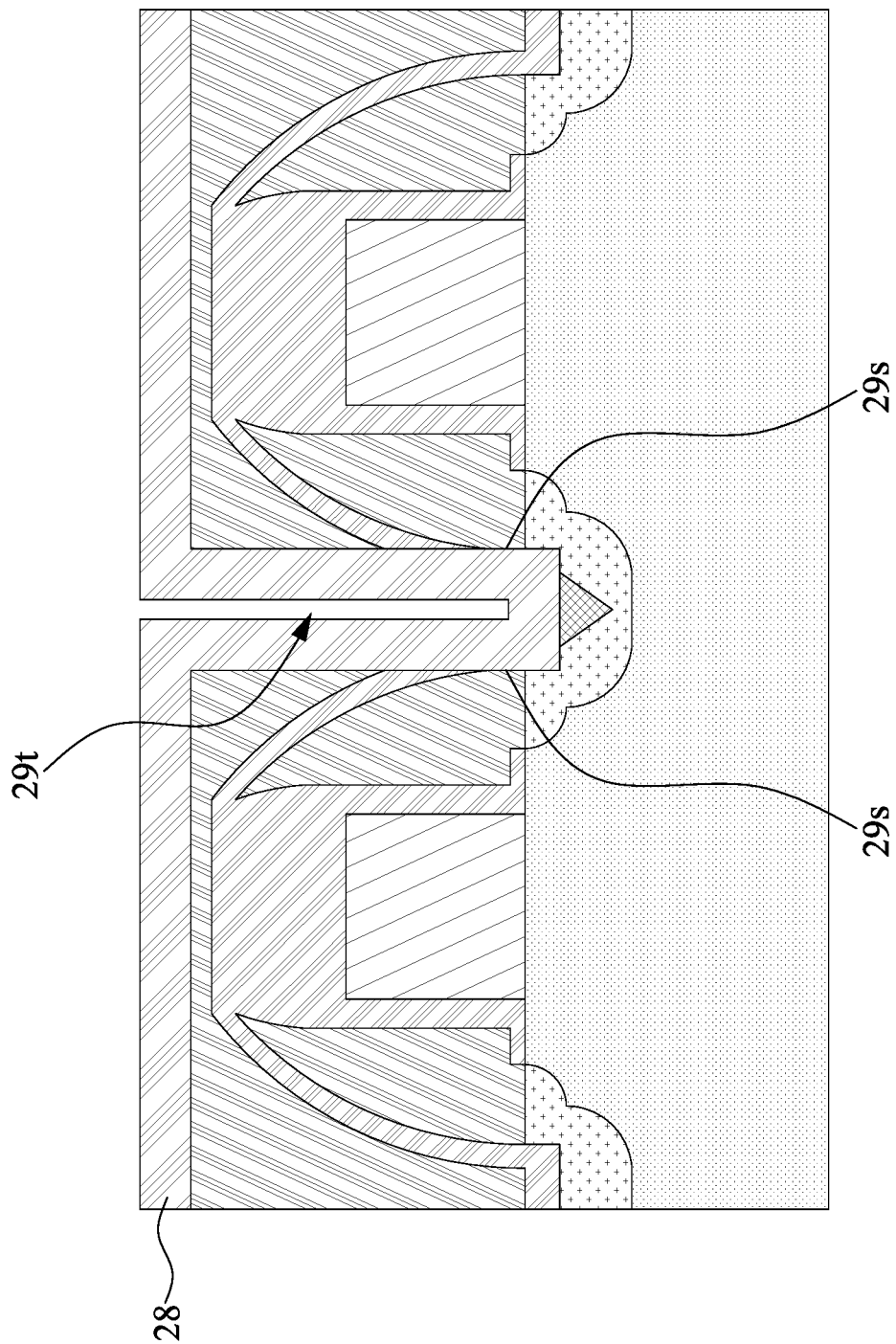
Figure 3M:
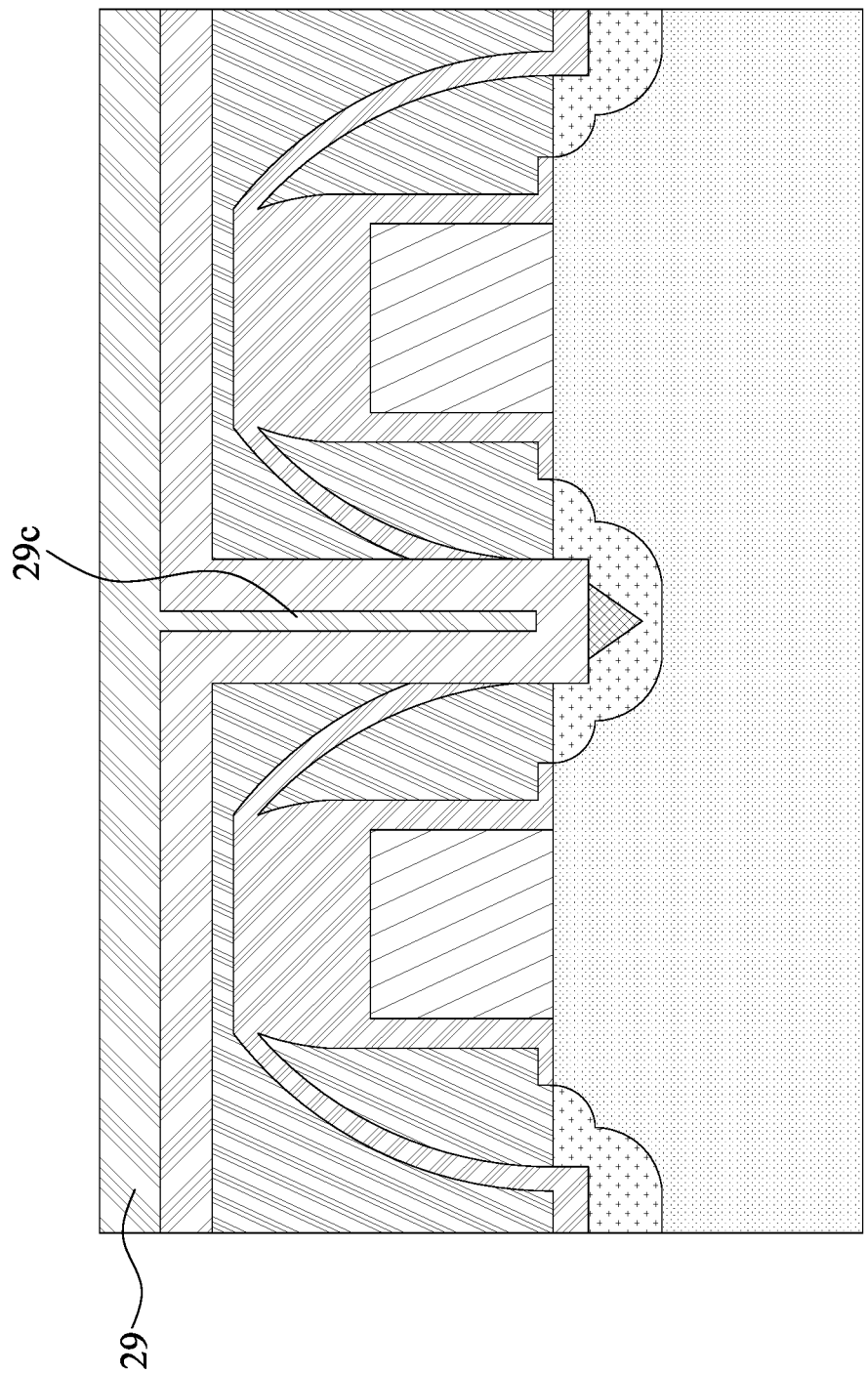

The stages of FIG. 3A, FIG. 3B, FIG. 3C, FIG. 3D, FIG. 3F, and FIG. 3G are the same as stated previously. FIG. 3K, FIG. 3L, and FIG. 3M follow the stage of FIG. 3G.

Referring to FIG. 3K, the layers 28', 30, and 32 can be removed completely, and the spacer 25 and the recessed portion 20r of the substrate 20 are exposed. The layers 28', 30, and 32 are removed by, for example, etching techniques. In some embodiments, the etching techniques comprise dry etching, wet etching, or the like.

Referring to FIG. 3L, a layer 28 can be formed on the structure shown in FIG. 3K. In some embodiments, the layer 28 can be formed on the spacer 25 and the recessed portion 20r of the substrate 20. In some embodiments, the layer 28 is formed on the sidewall 29s of the trench 29t. In some embodiments, the layer 28 can be formed by chemical vapor deposition (CVD). In some embodiments, the layer 28 comprises one of titanium, titanium nitride, tantalum, tantalum nitride, silicon oxide, silicon nitride, or the like. In some embodiments, the layer 28 comprises titanium nitride. In some embodiments, a thickness of the layer 28 is adjustable based on demands. In some embodiments, the thickness of the layer 28 may be in a range of about 1 to 5 nm. In some embodiments, the thickness of the layer 28 may be about 3 nm.

Referring to FIG. 3M, a layer 29 can be formed on the layer 28. In some embodiments, the layer 28 is used as a barrier layer to prevent the layer 29 from penetrating into the substrate 20. In some embodiments, the layer 29 can be formed by chemical vapor deposition (CVD). The layer 29 is also formed within the trench 29t. In some embodiments, the layer 29 formed within the trench 29t is a conductive contact 29c. The conductive contact 29c is formed between the gate structures 21a and 21b. In some embodiments, the layer 29 comprises metal materials. In some embodiments, the layer 29 comprises tungsten.

FIG. 3A, FIG. 3B, FIG. 3C, FIG. 3D, FIG. 3E, FIG. 3F, FIG. 3G, FIG. 3K, FIG. 3L, and FIG. 3M illustrate various stages of manufacturing a semiconductor device structure, in accordance with some embodiments of the present disclosure.

The stages of FIG. 3A, FIG. 3B, FIG. 3C, FIG. 3D, FIG. 3E, FIG. 3F, FIG. 3G are the same as stated previously. FIG. 3K, FIG. 3L, and FIG. 3M are also the same as stated previously. FIG. 3K, FIG. 3L, and FIG. 3M follow the stage of FIG. 3G.

Figure 4:
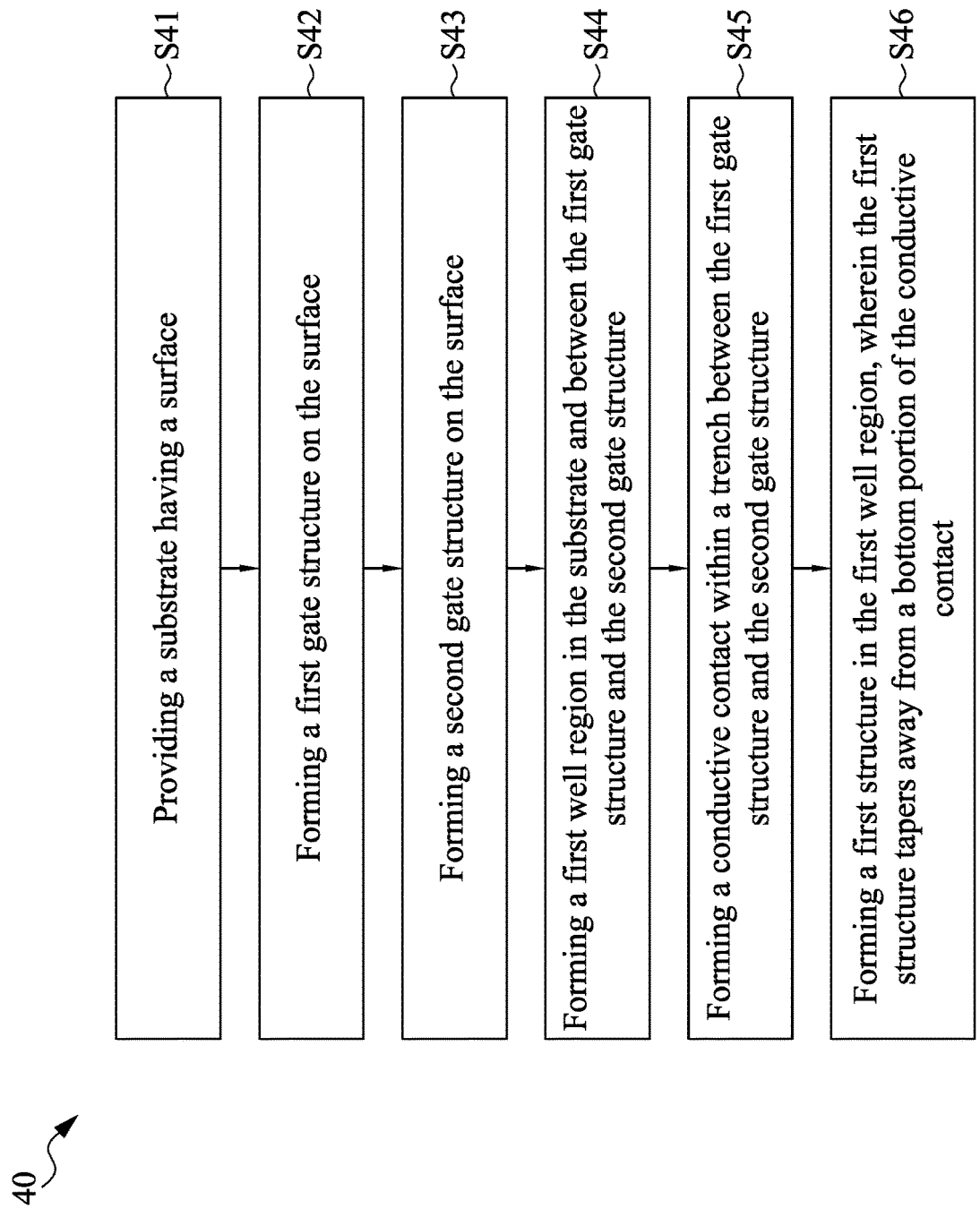
FIG. 4 is a flowchart illustrating a method for manufacturing a semiconductor device structure, in accordance with various aspects of the present disclosure.

FIG. 4 is a flowchart illustrating a method 40 for manufacturing a semiconductor device structure, in accordance with various aspects of the present disclosure.

The method 40 begins with operation S41 in which a substrate is provided. The substrate has a surface.

The method 40 continues with operation S42 in which a first gate structure is formed. The first gate structure is formed on the surface.

The method 40 continues with operation S43 in which a second gate structure is formed. The second gate structure is formed on the surface.

The method 40 continues with operation S44 in which a first well region is formed in the substrate. The first well region is formed between the first gate structure and the second gate structure.

The method 40 continues with operation S45 in which a conductive contact is formed within a trench. The trench is formed between the first gate structure and the second gate structure.

The method 40 continues with operation S46 in which a first structure is formed in the first well region. The first structure tapers away from a bottom portion of the conductive contact.

The method 40 is merely an example, and is not intended to limit the present disclosure beyond what is explicitly recited in the claims. Additional operations can be provided before, during, or after each operation of the method 40, and some operations described can be replaced, eliminated, or reorganized for additional embodiments of the method. In some embodiments, the method 40 can include further operations not depicted in FIG. 4.

Figure 5A:
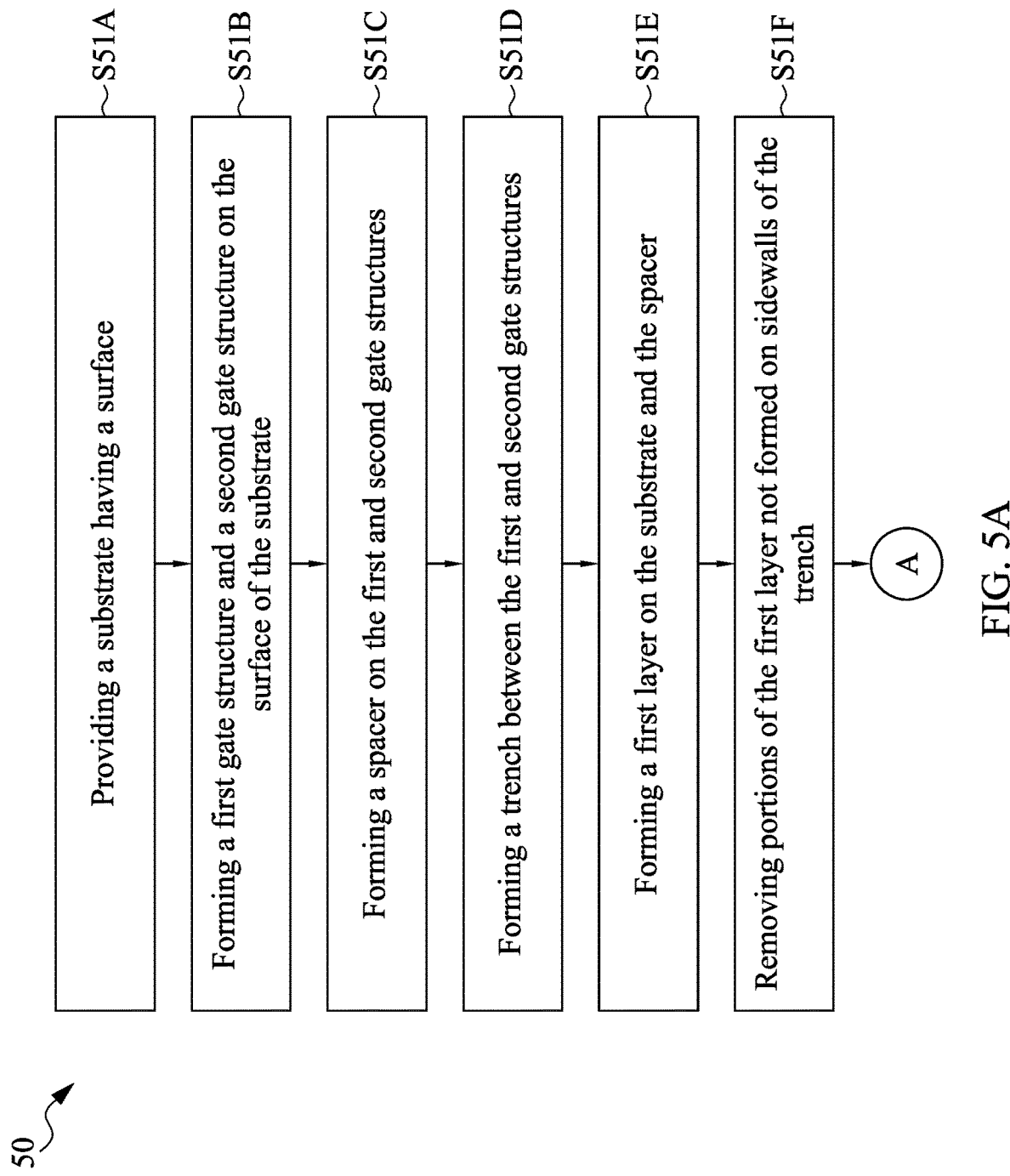
FIG. 5A and FIG. 5B are a flowchart illustrating a method for manufacturing a semiconductor device structure, in accordance with various aspects of the present disclosure.
Figure 5B:
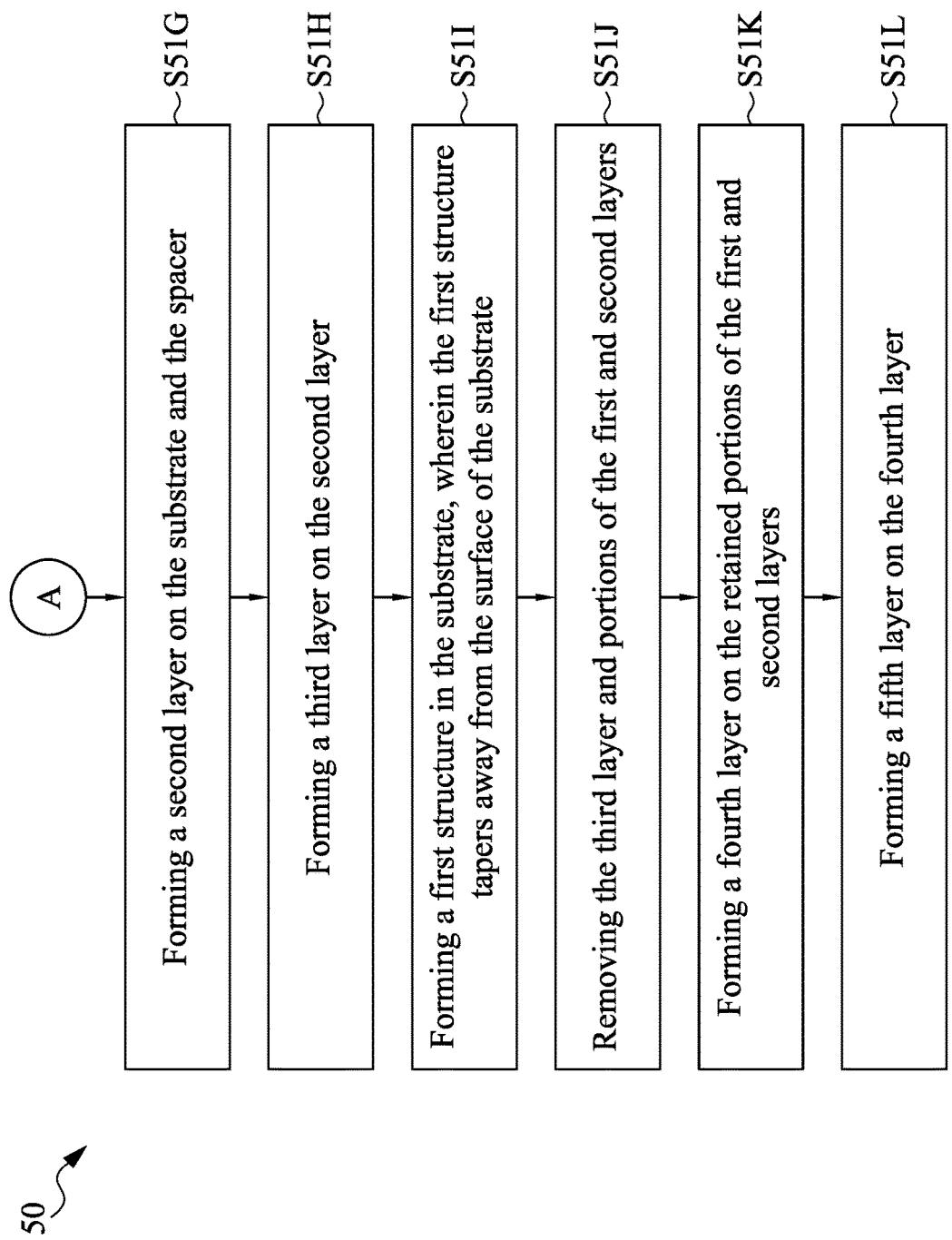

FIG. 5A and FIG. 5B are a flowchart illustrating a method for manufacturing a semiconductor device structure, in accordance with various aspects of the present disclosure.

Referring to FIG. 5A, the method 50 begins with operation S51A in which a substrate is provided. The substrate has a surface.

The method 50 continues with operation S51B in which a first gate structure and a second gate structure are formed. The first and second gate structures are formed on the surface of the substrate.

The method 50 continues with operation S51C in which a spacer is formed on the first and second gate structures.

The method 50 continues with operation S51D in which a trench is formed between the first and second gate structures. The operation S51D corresponds to the stage of FIG. 3A.

The method 50 continues with operation S51E in which a first layer is formed on the substrate and the spacer. The operation S51E corresponds to the stage of FIG. 3B. In some embodiment, the first layer comprises titanium nitride.

The method 50 continues with operation S51F in which portions of the first layer not formed on sidewalls of the trench are removed. The operation S51F corresponds to the stage of FIG. 3C.

Referring to FIG. 5B, the operation S51G follows the operation S51F. The method 50 continues with operation S51G in which a second layer is formed on the substrate and the spacer. The operation S51G corresponds to the stage of FIG. 3D. In some embodiment, the second layer comprises titanium nitride.

The method 50 continues with operation S51H in which a third layer is formed on the second layer. The operation S51H corresponds to the stage of FIG. 3F. In some embodiment, the third layer comprises cobalt.

The method 50 continues with operation S51I in which a first structure is formed in the substrate. The first structure tapers away from the surface of the substrate. The operation S51I corresponds to the stage of FIG. 3G.

The method 50 continues with operation S51J in which the third layer and portions of the first and second layers are removed. The operation S51J corresponds to the stage of FIG. 3H.

The method 50 continues with operation S51K in which a fourth layer is formed on the retained portions of the first and second layers. The operation S51K corresponds to the stage of FIG. 3I. In some embodiment, the fourth layer comprises titanium nitride.

The method 50 continues with operation S51L in which a fifth layer is formed on the fourth layer. The operation S51L corresponds to the stage of FIG. 3J. In some embodiment, the fifth layer comprises tungsten.

The method 50 is merely an example, and is not intended to limit the present disclosure beyond what is explicitly recited in the claims. Additional operations can be provided before, during, or after each operation of the method 50, and some operations described can be replaced, eliminated, or reorganized for additional embodiments of the method. In some embodiments, the method 50 can include further operations not depicted in FIG. 5A and FIG. 5B.

Figure 6A:
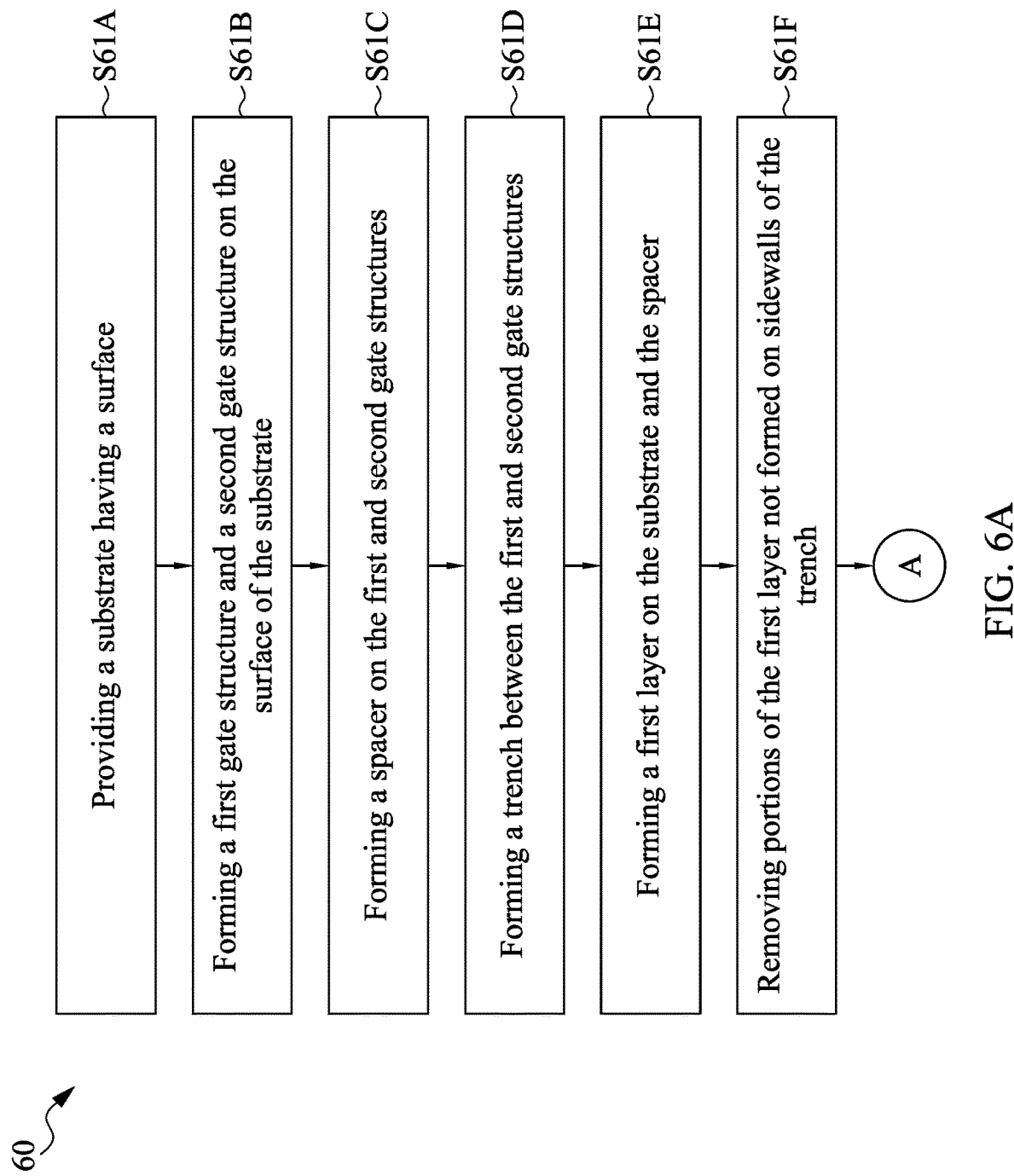
FIG. 6A and FIG. 6B are a flowchart illustrating a method for manufacturing a semiconductor device structure, in accordance with various aspects of the present disclosure.
Figure 6B:
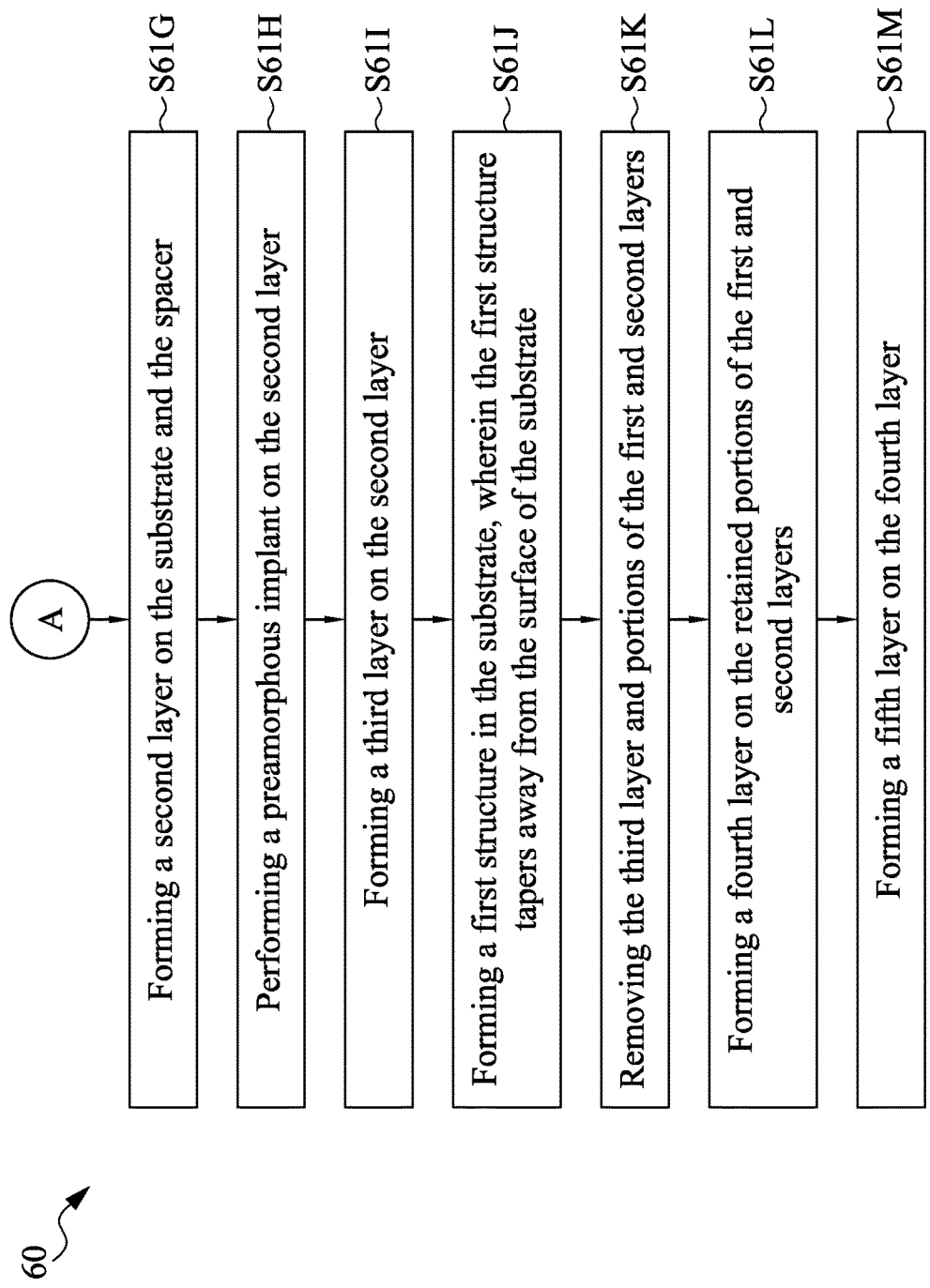

FIG. 6A and FIG. 6B are a flowchart illustrating a method for manufacturing a semiconductor device structure, in accordance with various aspects of the present disclosure.

Referring to FIG. 6A, the method 60 begins with operation S61A in which a substrate is provided. The substrate has a surface.

The method 60 continues with operation S61B in which a first gate structure and a second gate structure are formed. The first and second gate structures are formed on the surface of the substrate.

The method 60 continues with operation S61C in which a spacer is formed on the first and second gate structures.

The method 60 continues with operation S61D in which a trench is formed between the first and second gate structures. The operation S61D corresponds to the stage of FIG. 3A.

The method 60 continues with operation S61E in which a first layer is formed on the substrate and the spacer. The operation S61E corresponds to the stage of FIG. 3B. In some embodiment, the first layer comprises titanium nitride.

The method 60 continues with operation S61F in which portions of the first layer not formed on sidewalls of the trench are removed. The operation S61F corresponds to the stage of FIG. 3C.

Referring to FIG. 6B, the operation S61G follows the operation S61F. The method 60 continues with operation S61G in which a second layer is formed on the substrate and the spacer. The operation S61G corresponds to the stage of FIG. 3D. In some embodiment, the second layer comprises titanium nitride.

The method 60 continues with operation S61H in which a preamorphous implant is performed on the second layer. The operation S61H corresponds to the stage of FIG. 3E.

The method 60 continues with operation S61I in which a third layer is formed on the second layer. The operation S61I corresponds to the stage of FIG. 3F. In some embodiment, the third layer comprises cobalt.

The method 60 continues with operation S61J in which a first structure is formed in the substrate. The first structure tapers away from the surface of the substrate. The operation S61J corresponds to the stage of FIG. 3G.

The method 60 continues with operation S61K in which the third layer and portions of the first and second layers are removed. The operation S61K corresponds to the stage of FIG. 3H.

The method 60 continues with operation S61L in which a fourth layer is formed on the retained portions of the first and second layers. The operation S61L corresponds to the stage of FIG. 3I. In some embodiment, the fourth layer comprises titanium nitride.

The method 60 continues with operation S61M in which a fifth layer is formed on the fourth layer. The operation S61M corresponds to the stage of FIG. 3J. In some embodiment, the fifth layer comprises tungsten.

The method 60 is merely an example, and is not intended to limit the present disclosure beyond what is explicitly recited in the claims. Additional operations can be provided before, during, or after each operation of the method 60, and some operations described can be replaced, eliminated, or reorganized for additional embodiments of the method. In some embodiments, the method 60 can include further operations not depicted in FIG. 6A and FIG. 6B.

Figure 7A:
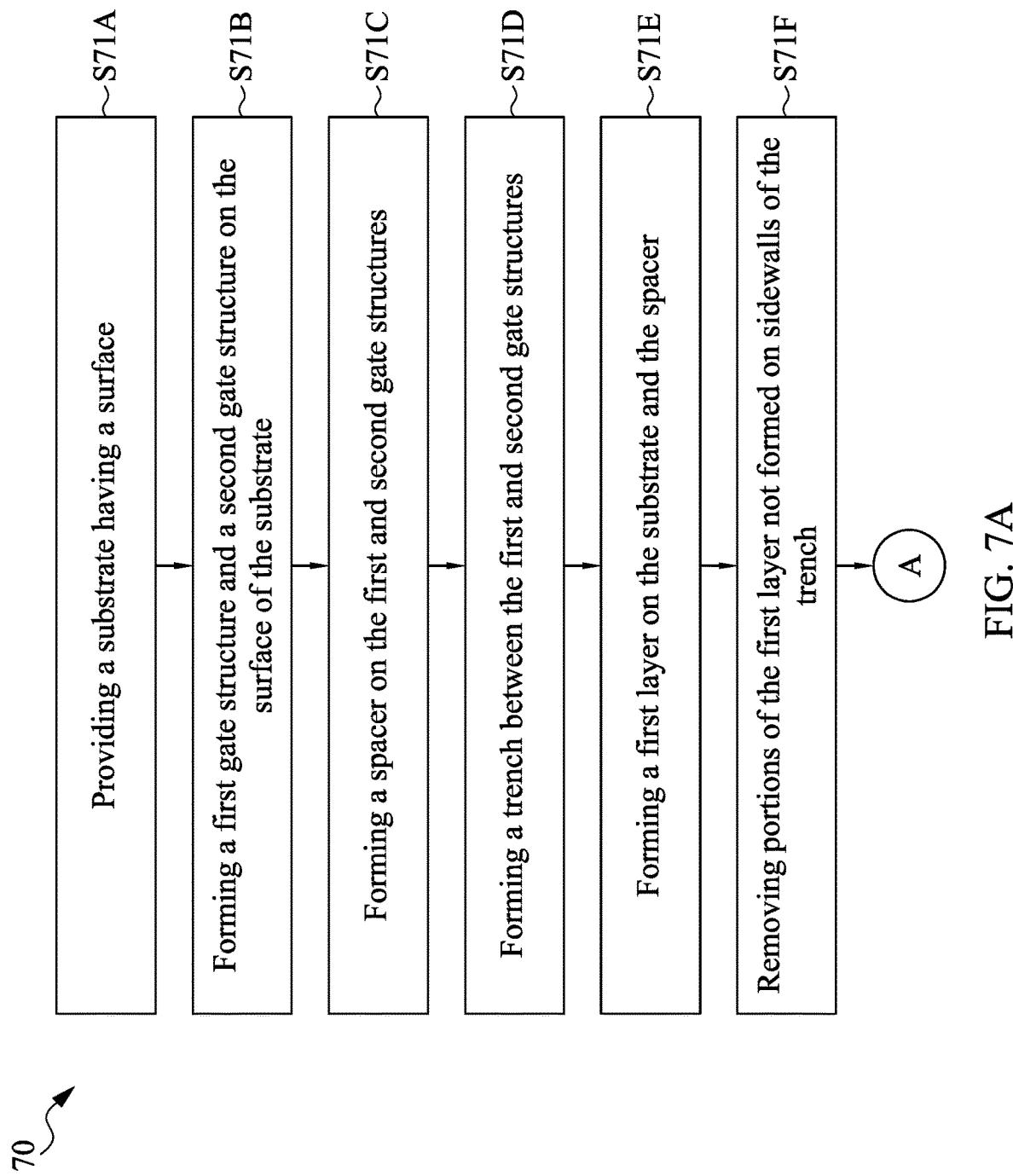
FIG. 7A and FIG. 7B are a flowchart illustrating a method for manufacturing a semiconductor device structure, in accordance with various aspects of the present disclosure.
Figure 7B:
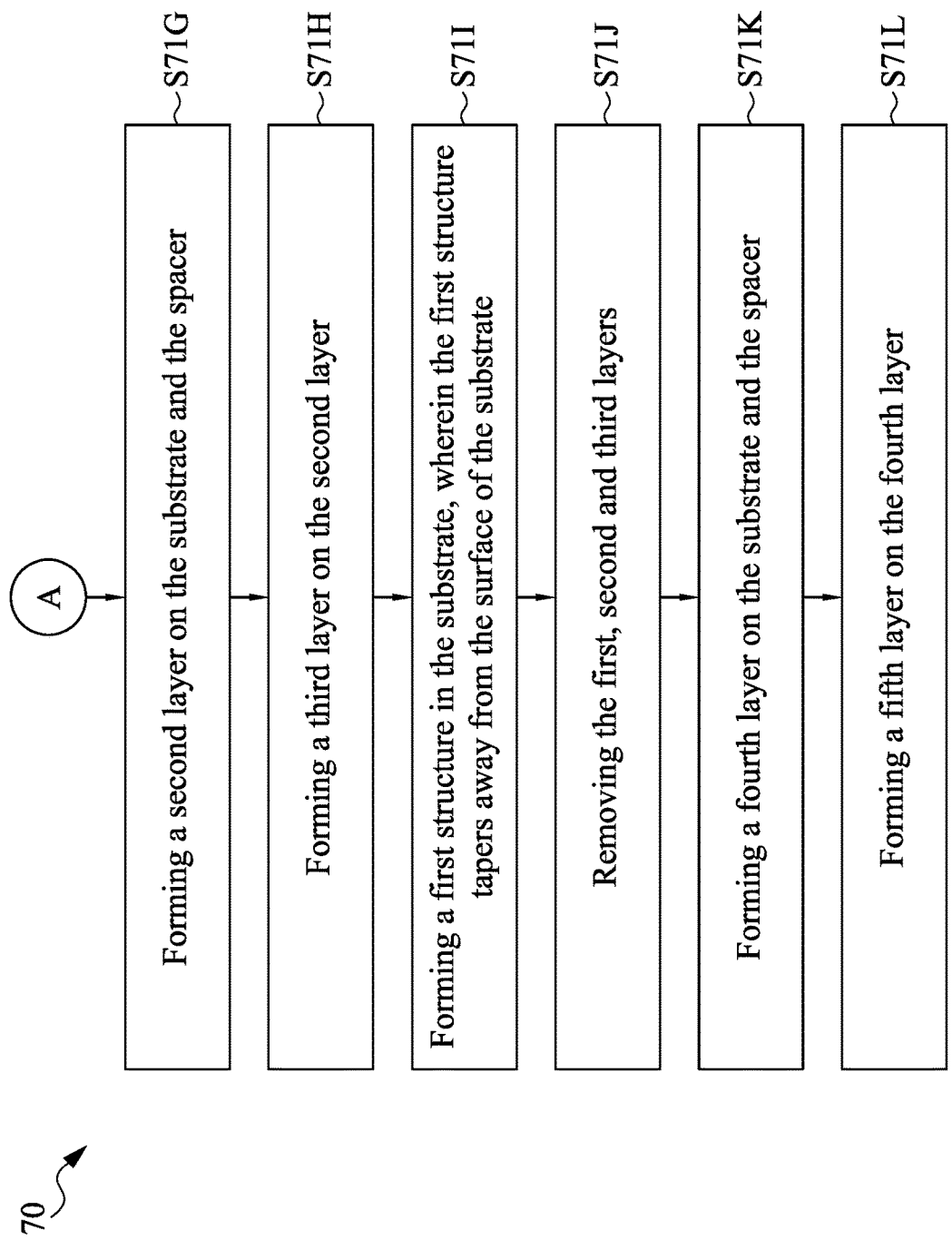

FIG. 7A and FIG. 7B are a flowchart illustrating a method for manufacturing a semiconductor device structure, in accordance with various aspects of the present disclosure.

Referring to FIG. 7A, the method 70 begins with operation S71A in which a substrate is provided. The substrate has a surface.

The method 70 continues with operation S71B in which a first gate structure and a second gate structure are formed. The first and second gate structures are formed on the surface of the substrate.

The method 70 continues with operation S71C in which a spacer is formed on the first and second gate structures.

The method 70 continues with operation S71D in which a trench is formed between the first and second gate structures. The operation S71D corresponds to the stage of FIG. 3A.

The method 70 continues with operation S71E in which a first layer is formed on the substrate and the spacer. The operation S71E corresponds to the stage of FIG. 3B. In some embodiment, the first layer comprises titanium nitride.

The method 70 continues with operation S71F in which portions of the first layer not formed on sidewalls of the trench are removed. The operation S71F corresponds to the stage of FIG. 3C.

Referring to FIG. 7B, the operation S71G follows the operation S71F. The method 70 continues with operation S71G in which a second layer is formed on the substrate and the spacer. The operation S71G corresponds to the stage of FIG. 3D. In some embodiment, the second layer comprises titanium nitride.

The method 70 continues with operation S71H in which a third layer is formed on the second layer. The operation S71H corresponds to the stage of FIG. 3F. In some embodiment, the third layer comprises cobalt.

The method 70 continues with operation S71I in which a first structure is formed in the substrate. The first structure tapers away from the surface of the substrate. The operation S71I corresponds to the stage of FIG. 3G.

The method 70 continues with operation S71J in which the first, second and third layers are removed. The operation S71J corresponds to the stage of FIG. 3K.

The method 70 continues with operation S71K in which a fourth layer is formed on the substrate and the spacer. The operation S71K corresponds to the stage of FIG. 3L. In some embodiment, the fourth layer comprises titanium nitride.

The method 70 continues with operation S71L in which a fifth layer is formed on the fourth layer. The operation S71L corresponds to the stage of FIG. 3M. In some embodiment, the fifth layer comprises tungsten.

The method 70 is merely an example, and is not intended to limit the present disclosure beyond what is explicitly recited in the claims. Additional operations can be provided before, during, or after each operation of the method 70, and some operations described can be replaced, eliminated, or reorganized for additional embodiments of the method. In some embodiments, the method 70 can include further operations not depicted in FIG. 7A and FIG. 7B.

Figure 8A:
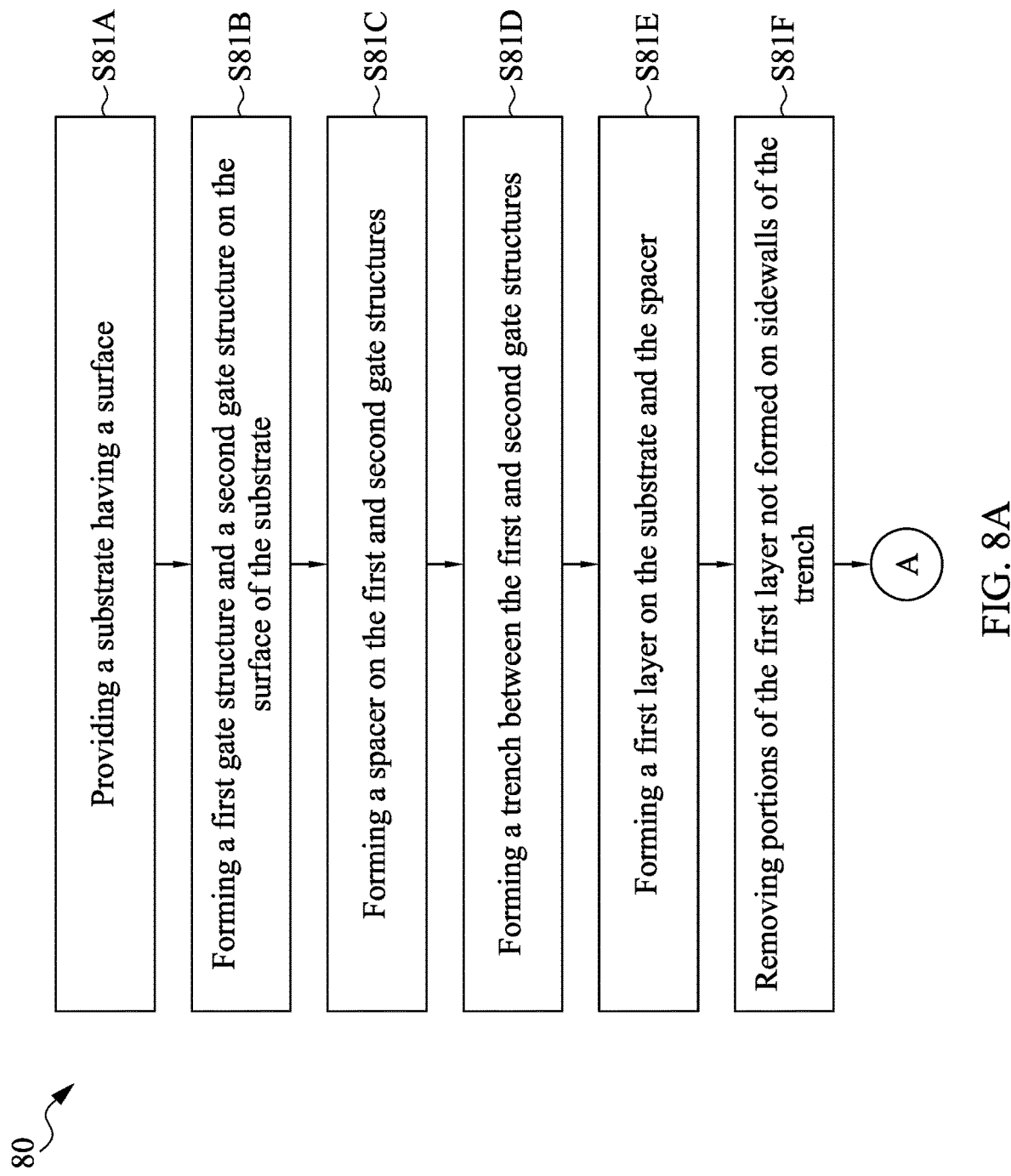
FIG. 8A and FIG. 8B are a flowchart illustrating a method for manufacturing a semiconductor device structure, in accordance with various aspects of the present disclosure.
Figure 8B:
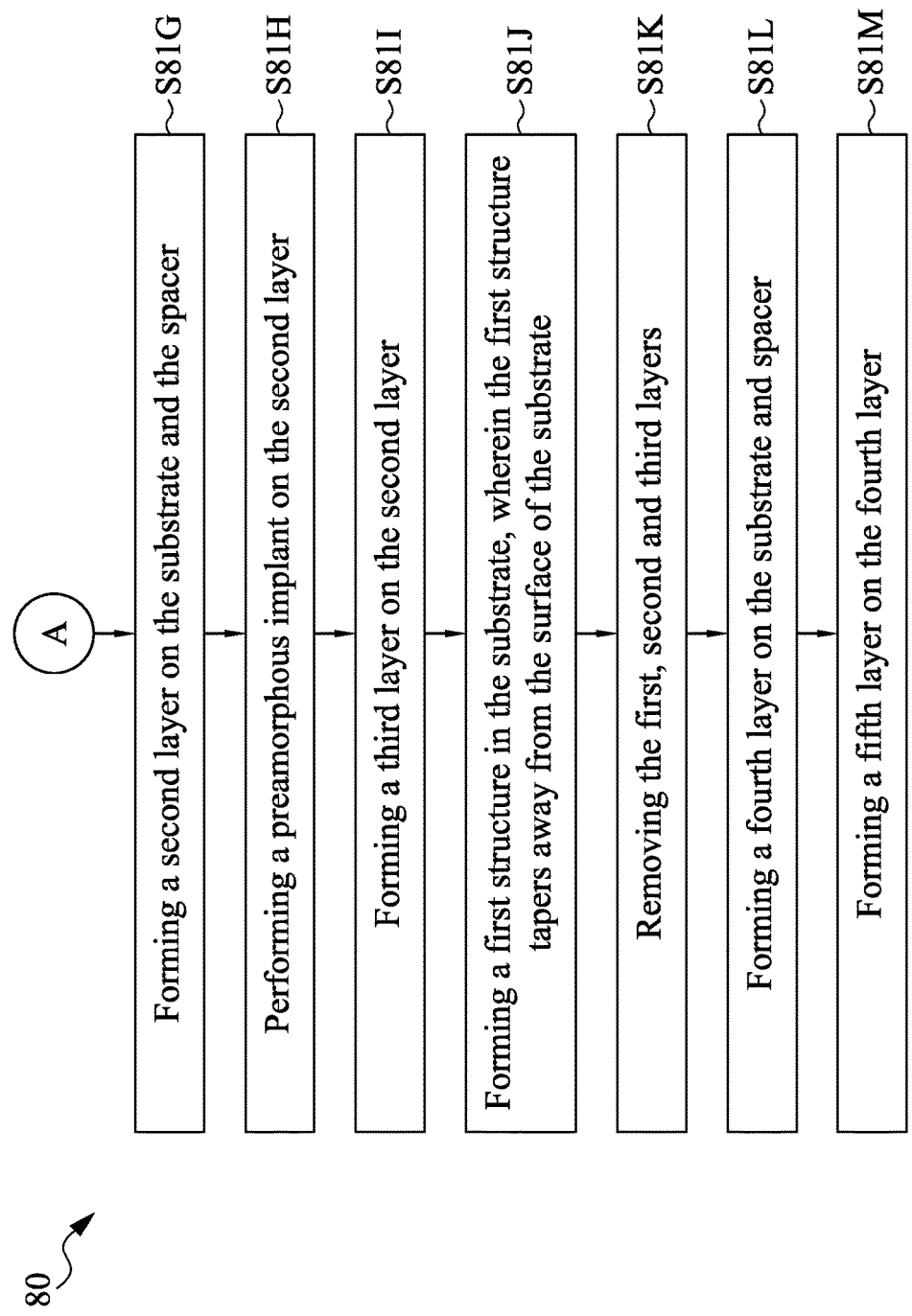

FIG. 8A and FIG. 8B are a flowchart illustrating a method for manufacturing a semiconductor device structure, in accordance with various aspects of the present disclosure.

Referring to FIG. 8A, the method 80 begins with operation S81A in which a substrate is provided. The substrate has a surface.

The method 80 continues with operation S81B in which a first gate structure and a second gate structure are formed of the substrate. The first and second gate structures are formed on the surface.

The method 80 continues with operation S81C in which a spacer is formed on the first and second gate structures.

The method 80 continues with operation S81D in which a trench is formed between the first and second gate structures. The operation S81D corresponds to the stage of FIG. 3A.

The method 80 continues with operation S81E in which a first layer is formed on the substrate and the spacer. The operation S81E corresponds to the stage of FIG. 3B. In some embodiment, the first layer comprises titanium nitride.

The method 80 continues with operation S81F in which portions of the first layer not formed on sidewalls of the trench are removed. The operation S81F corresponds to the stage of FIG. 3C.

Referring to FIG. 8B, the operation S81G follows the operation S81F. The method 80 continues with operation S81G in which a second layer is formed on the substrate and the spacer. The operation S81G corresponds to the stage of FIG. 3D. In some embodiment, the second layer comprises titanium nitride.

The method 80 continues with operation S81H in which a preamorphous implant is performed on the second layer. The operation S81H corresponds to the stage of FIG. 3E.

The method 80 continues with operation S81I in which a third layer is formed on the second layer. The operation S81I corresponds to the stage of FIG. 3F. In some embodiment, the third layer comprises cobalt.

The method 80 continues with operation S81J in which a first structure is formed in the substrate. The first structure tapers away from the surface of the substrate. The operation S81J corresponds to the stage of FIG. 3G.

The method 80 continues with operation S81K in which the first, second and third layers are removed. The operation S81K corresponds to the stage of FIG. 3K.

The method 80 continues with operation S81L in which a fourth layer is formed on the substrate and the spacer. The operation S81L corresponds to the stage of FIG. 3L. In some embodiment, the fourth layer comprises titanium nitride.

The method 80 continues with operation S81M in which a fifth layer is formed on the fourth layer. The operation S81M corresponds to the stage of FIG. 3M. In some embodiment, the fifth layer comprises tungsten.

The method 80 is merely an example, and is not intended to limit the present disclosure beyond what is explicitly recited in the claims. Additional operations can be provided before, during, or after each operation of the method 80, and some operations described can be replaced, eliminated, or reorganized for additional embodiments of the method. In some embodiments, the method 80 can include further operations not depicted in FIG. 8A and FIG. 8B.

Figure 9A:
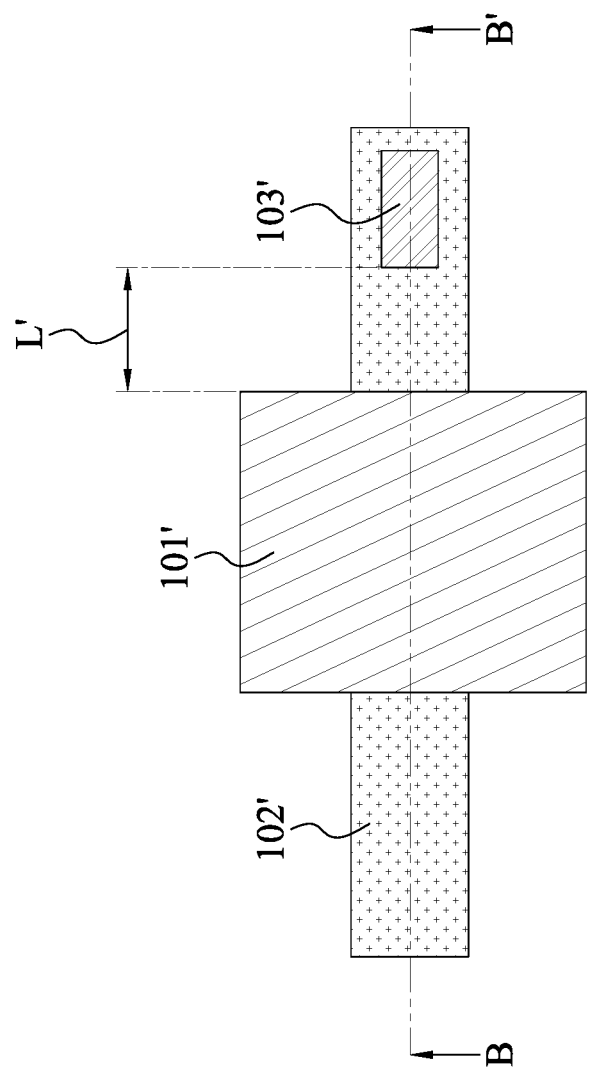
FIG. 9A is a schematic diagram of a top view of a layout of the gate and source/drain regions of a semiconductor device structure, in accordance with some comparative embodiments of the present disclosure.

FIG. 9A is a schematic diagram of a top view of a layout of the gate 101' and source/drain 102' of a semiconductor device structure 1', in accordance with some comparative embodiments of the present disclosure.

Referring to FIG. 9A, a contact region 103' is spaced apart from the gate region 101' by a distance L'. When the size of the semiconductor device structure 1 is reduced, the distance L needs to be reduced accordingly, since, when the gate length of the semiconductor device structure 1 is reduced, the threshold voltage of the semiconductor device structure 1 becomes difficult to control, which may cause unexpected current leakage. In conventional processes, cobalt silicide is formed on the sidewalls of the contact. The cobalt silicide can be elliptical. The cobalt silicide formed on the sidewalls of the contact may cause current leakage. To prevent the cobalt silicide from forming on the sidewalls of the contact, a layer of silicon nitride is formed on the sidewall of the contact. Although the layer of silicon nitride can prevent the cobalt silicide from forming on the sidewalls of the contact, it will increase contact resistance. The method disclosed herein eliminates the layer of silicon nitride. The cobalt silicide is pyramidal. The cobalt silicide allows the length L' to be reduced without causing current leakage, and also reduces contact resistance.

Figure 9B:
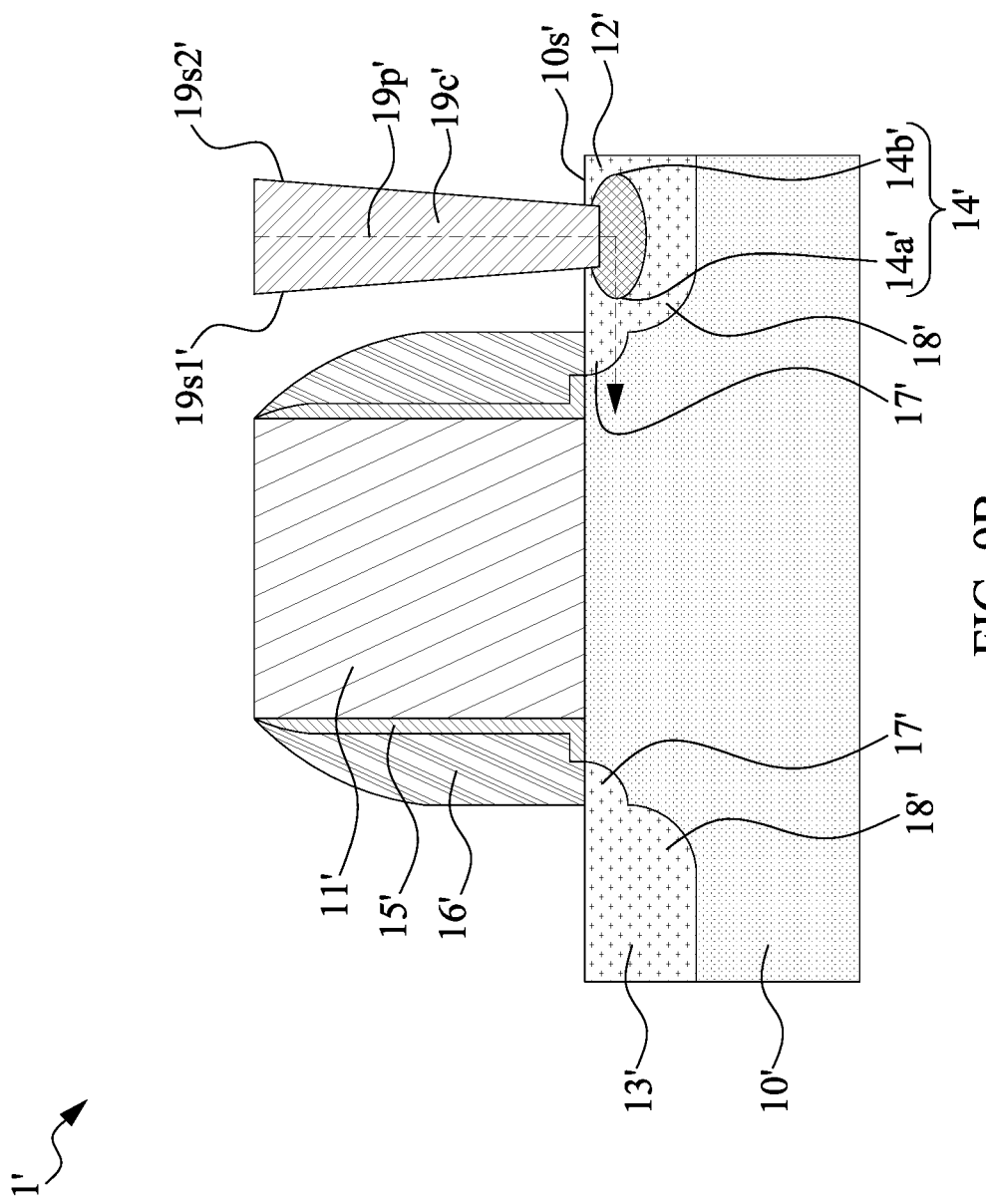
FIG. 9B is a cross-sectional view of a semiconductor device structure, along the dotted line B-B' shown in FIG. 9A, in accordance with some comparative embodiments of the present disclosure.

FIG. 9B is a cross-sectional view of a semiconductor device structure, along the dotted line B-B' shown in FIG. 9A, in accordance with some comparative embodiments of the present disclosure.

Referring to FIG. 9B, the semiconductor device structure 1' can include a substrate 10', a gate structure 11', a conductive contact 19c', a drain region 12', a source region 13', a silicide structure 14', spacers 15' and 16', lightly doped drain (LDD) regions 17', and halo regions 18'. The substrate 10' may have a surface 10s'. The gate structure 11' is formed on the surface 10s'. The drain region 12' is formed below the surface 10s'. The source region 13' is formed below the surface 10s'. The silicide structure 14' is formed below the surface 10s'. The silicide structure 14' has a curved/round profile. In some embodiments, the silicide structure 14' is elliptical.

Referring to FIG. 9B, a portion 14a' of the silicide structure 14' is formed on the sidewall 19s1' of the conductive contact 19c', and a portion 14b' of the silicide structure 14' is formed on the sidewall 19s2' of the conductive contact 19c'. Due to the portion 14a', the actual distance between the conductive contact 19c' and the gate structure 11' is less than distance L', thus increasing current leakage from the conductive contact 19c' to the gate structure 11'. As a result, the performance of the semiconductor device structure 1' may be adversely affected.

A current path 19p' directed from the drain region 12' to the source region 13' is shown with a dotted line. When comparing the semiconductor device structure 1' shown in FIG. 9B with the semiconductor device structure 1 shown in FIG. 1B, the cobalt silicide 14' shown in FIG. 9B is elliptical and the cobalt silicide 14 shown in FIG. 1B is pyramidal. As stated previously, the cobalt silicide 14' is more likely to cause leakage current than the cobalt silicide 14. When reducing the size of the semiconductor devices, it is preferred to use the cobalt silicide 14 than the cobalt silicide 14'.

One aspect of the present disclosure provides a semiconductor device structure. The semiconductor device structure includes a substrate, a first gate structure, a second gate structure, a first well region, and a first structure. The substrate has a first surface and a second surface opposite to the first surface. The first gate structure is disposed on the first surface. The second gate structure is disposed on the first surface. The first well region is in the substrate and between the first gate structure and the second gate structure. The first structure is disposed in the first well region. A shape of the first structure has an acute angle.

Another aspect of the present disclosure provides a semiconductor device structure. The semiconductor device structure includes a substrate, a first gate structure, a second gate structure, a conductive contact, a first well region, and a first structure. The substrate has a surface. The first gate structure is disposed on the first surface. The second gate structure is disposed on the first surface. The conductive contact is between the first gate structure and the second gate structure. The first well region is in the substrate and between the first gate structure and the second gate structure. The first structure is embedded within the first well region and tapers away from a bottom portion of the conductive contact. The first structure comprises cobalt silicide.

Another aspect of the present disclosure provides a method for manufacturing a semiconductor device structure. The method includes: providing a substrate having a first surface; forming a first gate structure on the surface; forming a second gate structure on the surface; forming a first well region in the substrate and between the first gate structure and the second gate structure; forming a conductive contact within a trench between the first gate structure and the second gate structure; and forming a first structure in the first well region, wherein the first structure tapers away from a bottom portion of the conductive contact.

The embodiments of the present disclosure disclose a semiconductor device structure with a metal silicide in a substrate. The aforesaid metal silicide is absent from sidewalls of a trench between gate structures of the semiconductor device structure. This lowers contact resistance in the semiconductor device structure. Further, the semiconductor device structure includes a titanium nitride layer. The titanium nitride layer is used as a diffusion barrier layer for forming the metal silicide. The thickness of the titanium nitride layer is adjustable to prevent the metal silicide from forming on the sidewalls of the trench between gate structures of the semiconductor device structure, and to prevent the contact resistance from increasing. In a comparative example, silicon oxides/silicon nitrides are formed on the sidewalls of the trench between gate structures of the semiconductor device structure. The silicon oxides/silicon nitrides have larger contact resistances and thus increase the contact resistance between the gate structure and the metal silicide. In comparison with the comparative example, the thickness of the titanium nitride in the embodiments of the present disclosure can be adjusted, so as to prevent the metal silicide from forming on the sidewalls of the trench between gate structures of the semiconductor device structure and to prevent the contact resistance from increasing, and thus the performance of the semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device structure, comprising:
   providing a substrate having a surface which is defined as an upper surface of the substrate;
   forming a first gate structure on and in direct contact with the surface;
   forming a second gate structure on and in direct contact with the surface, wherein the first gate structure and the second gate structure are spaced apart from each other to form a trench therebetween;
   forming a first well region in the substrate and between the first gate structure and the second gate structure, wherein the first well region is formed below the surface of the substrate at a position that a top surface of the first well region is coplanar with the surface of the substrate;
   forming a conductive contact within the trench between the first gate structure and the second gate structure;
   forming a first structure within the first well region at a position that a top surface of the first structure is below the surface of the substrate, wherein the first structure tapers away from a bottom portion of the conductive contact; and
   forming a first layer, wherein the first layer has a bottom portion embedded in the substrate and two vertical walls upwardly extended from the bottom portion to receive the conductive contact between the two vertical walls, wherein a bottom surface of the bottom portion of the first layer is in contact with the top surface of the first structure, wherein a width of the bottom portion of the first layer is larger than a length of the top surface of the first structure.

2. The method of claim 1, further comprising forming a first spacer which has a first portion on the first gate structure and a second portion on the second gate structure, wherein the first portion of the first spacer extends continuously from the first gate structure toward the first well region to contact with one of the vertical walls of the first structure, wherein the second portion of the first spacer extends continuously from the second gate structure toward the first well region to contact with another vertical wall of the first structure.

3. The method of claim 2, further comprising forming a second spacer on the first spacer, wherein the second spacer has a first portion formed on and in contact with the first portion of the first spacer, a second portion formed on and in contact with the second portion of the first spacer, a third portion encapsulated by the substrate and the first portion of the first spacer to cover a portion of the top surface of the first well region, and a fourth portion encapsulated by the substrate and the second portion of the first spacer to cover another portion of the top surface of the first well region.

4. The method of claim 3, wherein the first layer is formed on the second spacer by chemical vapor deposition (CVD), wherein a bottom surface of the conductive contact is in contact with the bottom portion of the first layer.

5. The method of claim 4, further comprising removing portions of the first layer other than sidewalls of the trench, wherein two remaining portions of the first layer are formed as the two vertical walls of the first layer which are formed on and in contact with the sidewalls of the trench respectively.

6. The method of claim 5, further comprising forming a second layer in the first well region to be coplanar with the surface of the substrate and the second spacer.

7. The method of claim 6, further comprising performing an implant on the second layer.

8. The method of claim 6, further comprising forming a third layer on the second layer, wherein a portion of the third layer is disposed within the trench.

9. The method of claim 7, further comprising forming a third layer on the second layer, wherein a portion of the third layer is disposed within the trench.

10. The method of claim 8, further comprising forming the first structure by a thermal process.

11. The method of claim 10, further comprising removing the third layer after the first structure is formed by the thermal process.

12. The method of claim 11, further comprising forming a fourth layer on two remaining portions of the first layer and the second layer, wherein a portion of the fourth layer is disposed within the trench.

13. The method of claim 12, further comprising forming a fifth layer on the fourth layer, wherein a portion of the fifth layer is disposed within the trench.

14. The method of claim 4, wherein the first structure is absent from a vertical surface of the first layer.

15. The method of claim 11, wherein the third layer is removed and portions of the first layer and the second layer are retained.

16. The method of claim 11, wherein the first layer, the second layer and the third layer are removed to expose the first portion of the second spacer, the second portion of the second spacer, and the substrate so as to expose the first structure below the top surface of the substrate.

17. The method of claim 2, wherein the first gate structure is enclosed by the first portion of the first spacer and the surface of the substrate, wherein the second gate structure is enclosed by the second portion of the first spacer and the surface of the substrate.

18. The method of claim 5, wherein lower ends of the two remaining portions of the first layer are below the surface of the substrate.

19. The method of claim 1, wherein the length of the top surface of the first structure is smaller than a width of the trench, wherein the conductive contact has a uniform width.

20. The method of claim 1, wherein the first structure has a pyramidal shape and has an acute angle in cross section at a bottom end.

* * * * *